(12) United States Patent
Kim et al.

(10) Patent No.: US 7,915,822 B2
(45) Date of Patent: Mar. 29, 2011

(54) DISPLAY DEVICE AND METHOD AND APPARATUS FOR MANUFACTURING THE SAME

(75) Inventors: Hoon Kim, Suwon-si (KR); Nam-Deog Kim, Yongin-si (KR); Jae-Hoon Chung, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 302 days.

(21) Appl. No.: 12/170,697

(22) Filed: Jul. 10, 2008

(65) Prior Publication Data

US 2008/0265764 A1     Oct. 30, 2008

Related U.S. Application Data

(63) Continuation-in-part of application No. 11/195,672, filed on Aug. 3, 2005, now abandoned.

(30) Foreign Application Priority Data

Aug. 4, 2004 (KR) .................................. 200461493
May 16, 2005 (KR) .................................. 200540729

(51) Int. Cl.
*H01J 1/62* (2006.01)
(52) U.S. Cl. ......................... 313/512; 313/506; 313/509

(58) Field of Classification Search ........... 313/498–512
See application file for complete search history.

(56) References Cited

U.S. PATENT DOCUMENTS

| 6,639,360 | B2 | 10/2003 | Roberts et al. |
| 6,710,542 | B2 | 3/2004 | Chun et al. |
| 2002/0149312 | A1 | 10/2002 | Roberts et al. |
| 2003/0173897 | A1* | 9/2003 | Iwase et al. .................. 313/512 |
| 2003/0184222 | A1* | 10/2003 | Nilsson et al. ............... 313/512 |
| 2003/0189403 | A1 | 10/2003 | Yamada et al. |
| 2004/0004434 | A1 | 1/2004 | Nishi et al. |
| 2004/0021416 | A1 | 2/2004 | Chun et al. |
| 2005/0140282 | A1 | 6/2005 | Park et al. |
| 2006/0022592 | A1 | 2/2006 | Boroson |
| 2007/0160789 | A1 | 7/2007 | Merical et al. |

FOREIGN PATENT DOCUMENTS

CN            1471065 A        1/2004

* cited by examiner

*Primary Examiner* — Bumsuk Won
(74) *Attorney, Agent, or Firm* — Cantor Colburn LLP

(57) ABSTRACT

A display device includes a first substrate, a second substrate and a blocking member. The first substrate has a light emitting element. The second substrate faces the first substrate. The blocking member is arranged between the first and second substrates. The blocking member includes a first blocking layer and a second blocking layer.

15 Claims, 21 Drawing Sheets

HEAT OR LIGHT

DISPLAY DEVICE AND METHOD AND APPARATUS FOR MANUFACTURING THE SAME

CROSS REFERENCE TO RELATED APPLICATIONS

This application is a continuation-in-part application of U.S. application Ser. No. 11/195,672 filed Aug. 3, 2005, which claims priority to and the benefit of Korean Patent Application No. 2004-61493, filed on Aug. 4, 2004, and Korean Patent Application No. 2005-40729, filed on May 16, 2005, which are hereby incorporated by reference for all purposes as if fully set forth herein.

BACKGROUND OF THE INVENTION

1. Field of the Invention

The present invention relates to a display device, and a method and apparatus for manufacturing the display device. More particularly, the present invention relates to a display device having an increased lifespan, and a method and apparatus for manufacturing the display device.

2. Discussion of the Background

Generally, a display device converts an electric signal processed by an information processing device into an image.

Examples of a display device include a cathode ray tube (CRT), a liquid crystal display (LCD) device, an organic light emitting element (OLED), etc.

The OLED has many advantages including it may be made small and lightweight. Therefore, the OLED is used in various fields.

Generally, the OLED includes an organic light emitting layer for emitting light. However, when the organic light emitting layer is exposed to moisture or air, it may be damaged, which reduces the lifespan of the OLED.

SUMMARY OF THE INVENTION

The present invention provides a display device having an increased lifespan.

The present invention also provides a method for manufacturing the display device.

The present invention also provides an apparatus for manufacturing the display device.

Additional features of the invention will be set forth in the description which follows, and in part will be apparent from the description, or may be learned by practice of the invention.

The present invention discloses a display device including a first substrate, a second substrate and a blocking member. The first substrate has a light emitting element. The second substrate faces the first substrate. The blocking member is arranged between the first and second substrates. The blocking member includes a first blocking layer and a second blocking layer.

The present invention also discloses a method for manufacturing a display device including forming a first blocking layer on a first substrate and curing the first blocking layer. A second blocking layer is formed on a second substrate. The first substrate having the first blocking layer is assembled with the second substrate having the second blocking layer such that the first blocking layer faces the second blocking layer. Then, the second blocking layer is cured to form a blocking member that combines the first and second substrates.

The present invention also discloses a method for forming a display device including forming a first blocking layer on a first substrate and curing the first blocking layer. A second blocking layer is formed on the first blocking layer. The first substrate having the first and second blocking layers is assembled with a second substrate under a first pressure. The first and second blocking layers are cured under a second pressure that is higher than the first pressure.

The present invention also discloses a method for forming a display device including forming a first blocking layer on a first substrate. A second blocking layer is formed on a second substrate, and the second blocking layer is cured. The first and second substrates are assembled with each other under a first pressure such that the first blocking layer of the first substrate faces the second blocking layer of the second substrate. The first and second blocking layers are cured under a second pressure that is higher than the first pressure.

The present invention also discloses an apparatus for manufacturing a display device including a chamber, a supporting unit, a gripper, a transferring unit and an optical unit. The chamber has a pressure control device. The supporting unit is arranged in the chamber. The supporting unit supports a first substrate. The gripper grips a second substrate that faces the first substrate. The transferring unit transfers one of the supporting unit and the gripper along a substantially longitudinal direction in order to arrange the second substrate over the first substrate. The optical unit provides the first and second substrates with light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DESCRIPTION OF THE ILLUSTRATED EMBODIMENTS

It should be understood that the exemplary embodiments of the present invention described below may be varied in many different ways without departing from the inventive principles disclosed herein, and the scope of the present invention is therefore not limited to these particular illustrated embodiments. Rather, these embodiments are provided so that this disclosure will be thorough and complete, and will fully convey the concept of the invention to those skilled in the art by way of example and not of limitation.

Hereinafter, the embodiments of the present invention will be described in detail with reference to the accompanying drawings. It is noted that various changes, substitutions and alterations can be made herein without departing from the spirit and scope of the invention. The embodiments are only examples for showing the spirit of the present invention to a person skilled in the art. In the figures, a thickness of layers is exaggerated for clarity. The term "arranged on" includes "arranged over". In other words, something may be arranged therebetween. The term "arranged directly on" means that nothing is arranged therebetween.

Figure 1:
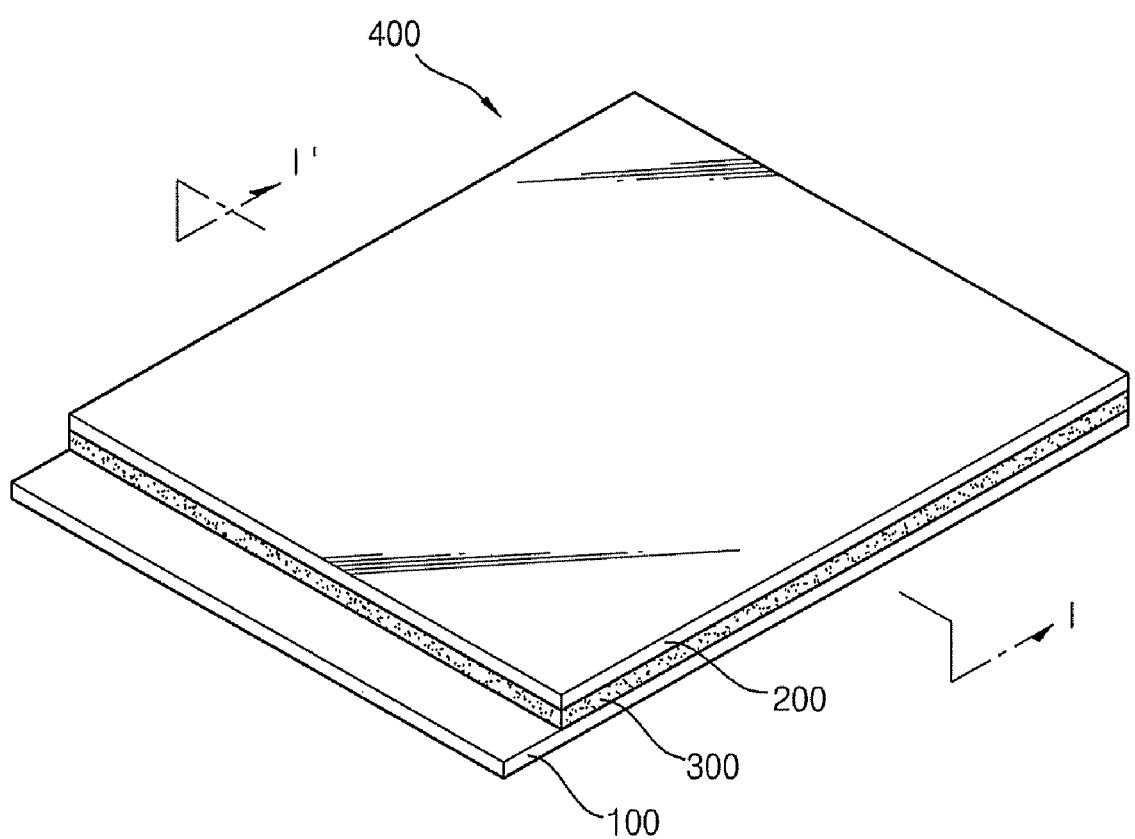
FIG. 1 is a perspective view illustrating a display device according to an exemplary embodiment of the present invention.
Figure 2:
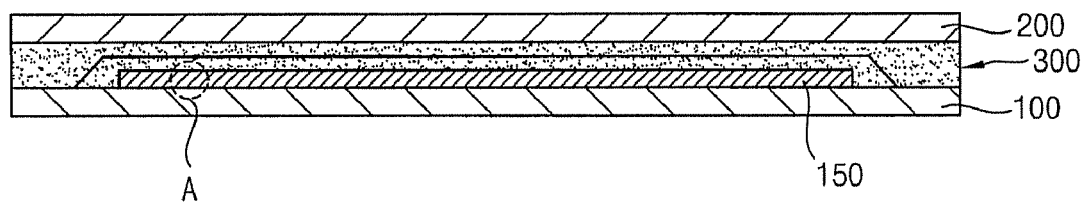
FIG. 2 is a cross-sectional view taken along line I-I' of FIG. 1.

FIG. 1 is a perspective view showing a display device according to an exemplary embodiment of the present invention, and FIG. 2 is a cross-sectional view taken along line I-I' of FIG. 1.

Referring to FIG. 1 and FIG. 2, a display device 400 may include a first substrate 100, a second substrate 200 and a blocking member 300.

The first substrate 100 may be a transparent substrate made of glass, for example. The first substrate 100 may have, for example, a rectangular plate shape.

Referring to FIG. 2, a light emitting element 150 may be formed on the first substrate 100. The light emitting element 150 may be an organic light emitting element.

The second substrate 200 may be arranged on the first substrate 100 such that the second substrate 200 faces the light emitting element 150 and prevents the light emitting element 150 from being exposed to moisture or air. When the light emitting element 150 is exposed to moisture or air, it may be damaged, which reduces the lifespan of the display device 400.

The second substrate 200 may be made of the same material as the first substrate 100. Alternatively, the second substrate 200 may include a material such as soda-lime glass, borosilicate glass, silicate glass, lead glass, etc.

The second substrate 200 may be about 0.1 mm to about 10 mm thick in order to prevent the light emitting element 150 from being exposed to moisture or air. More preferably, the second substrate 200 may be about 1 mm to about 10 mm thick. When the second substrate 200 is about 1 mm to about 10 mm thick, it may prevent the light emitting element 150 from being exposed to moisture or air, and it may withstand some external impacts. When the second substrate 200 is thicker than about 10 mm, it becomes too heavy. Even though the light emitting element 150 may be arranged between the first and second substrates 100 and 200, the light emitting element 150 may still be exposed to moisture and air.

Hence, a blocking member 300 may be utilized to encapsulate the light emitting element 150. The blocking member 300 may also combine the first and second substrates 100 and 200.

The blocking member 300 is arranged between the first and second substrates 100 and 200, and it may include, for example, an organic material. The organic material of the blocking member 300 absorbs moisture and air to prevent the light emitting element 150 from being exposed to moisture and air. Therefore, the lifespan of the light emitting element 150 may be increased.

The blocking member 300 may include, for example, a thermosetting resin. Alternatively, the blocking member 300 may include a photocurable resin that is cured when ultraviolet light is irradiated onto the photocurable resin. Further, the blocking member 300 may include a resin that is cured when heat is applied to the resin and/or ultraviolet light is irradiated onto the resin.

Examples of the blocking member 300 include urea resins, melamine resins, phenol resins, resorcinol resins, epoxy resins, unsaturated polyester resins, polyurethane resins, acrylic resins, vinyl acetate resins, ethylene-vinyl acetate copolymer resins, acrylic resins, cyanoacrylates resins, polyvinyl alcohol resins, polyamide resins, polyolefin resins, polyurethane resins, saturated polyester resins, celluloses.

The blocking member 300 may also include acrylates, urethane acrylates, epoxy acrylates, melamine acrylates, acrylic resin acrylate, urethane polyesters, vinyl ether resins, synthetic polymers such as vinyl-phenolics, chloroprene-phenolics, nitrile-phenolics, Nylon-phenolics, epoxy-phenolics, nitrile-phenolics or rubbers such as chloroprene rubbers, nitrile rubbers, styrene-butadiene rubbers, natural rubbers, butyl rubbers and silicone rubbers.

The blocking member 300 may further include a material that may be reacted with moisture and/or air, for example, calcium (Ca), barium (Ba), aluminum (Al), nickel (Ni), silver (Ag) calcium oxide (CaO), barium oxide (BaO), magnesium oxide (MgO), silicon oxide (SiOx), silicon nitride (SiNx, lithium oxide (Li2O) etc. in order to increase the lifespan of the light emitting element 150 by preventing the light emitting element 150 from being exposed to moisture and air.

Additionally, the blocking member 300 may prevent the first substrate 100 or the second substrate 200 from sagging. Hereinafter, display devices according to various embodiments of the present invention will be explained in detail.

Figure 3:
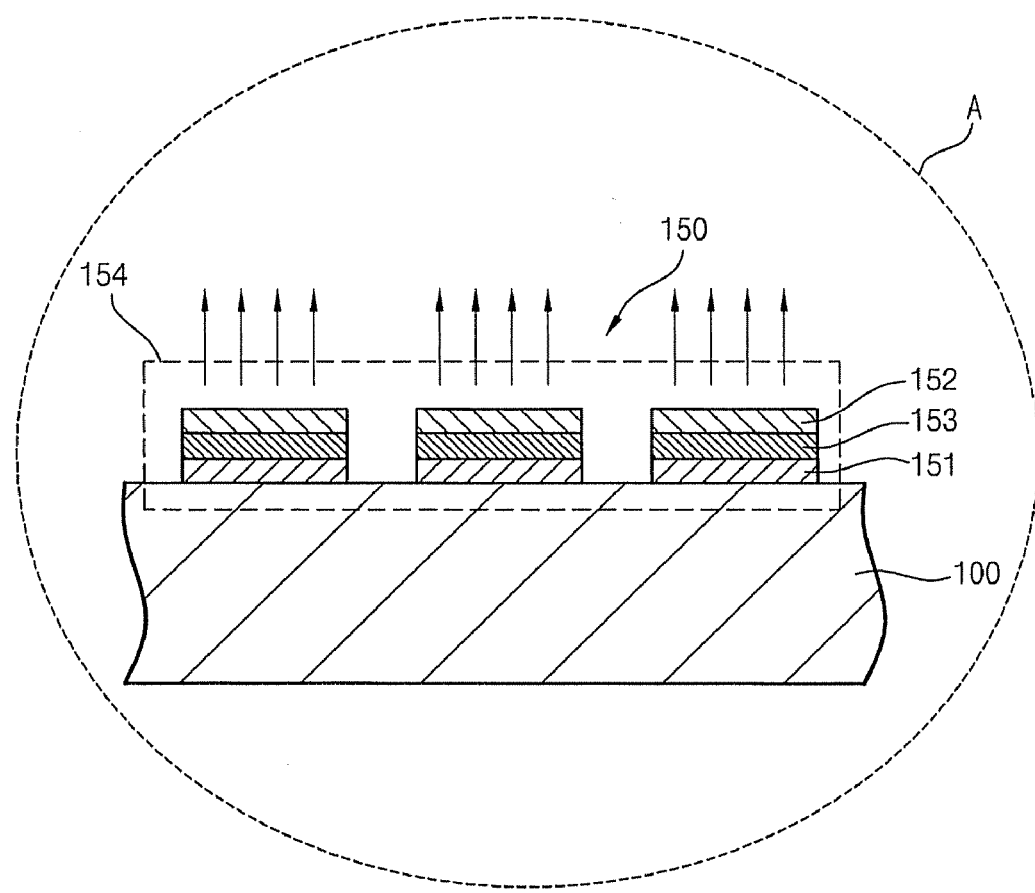
FIG. 3 is an enlarged view showing a portion 'A' of FIG. 2.

FIG. 3 is an enlarged view showing portion 'A' of FIG. 2. The display device as shown in FIG. 3 is the same as that in FIG. 2 except that portion 'A' shows the light emitting element 150 in detail.

Referring to FIG. 3, the light emitting element 150 includes a plurality of organic light emitting sections 154. Each organic light emitting section 154 includes a first electrode 151, a second electrode 152 and a light emitting layer 153.

The first electrode 151 is arranged, for example, on the first substrate 100. The light emitting layer 153 is arranged on the first electrode 151, and the second electrode 152 is arranged on the light emitting layer 153. In other words, the light emitting layer 153 is arranged between the first and second electrodes 151 and 152.

The first electrode 151 may include, for example, a metal such as calcium (Ca), barium (Ba), magnesium (Mg), silver (Ag), copper (Cu), aluminum (Al), and an alloy thereof. A protection layer (not shown) may be formed on the first electrode 151. The protection layer may include an optically transparent and electrically conductive material such as indium tin oxide (ITO), indium zinc oxide (IZO), amorphous indium tin oxide (a-ITO), etc. A light reflecting layer (not shown) may be formed on the first electrode 151, or between the first electrode 151 and the first substrate 100. The light reflecting layer may include, for example, chromium (Cr), molybdenum (Mo), aluminum (Al), silver (Ag), etc. For example, when the display resolution is 1024×768, 1024×768×3 first electrodes 151 may be arranged on the first substrate 100 in a matrix shape.

The second electrode 152 may include an optically transparent and electrically conductive material such as indium tin oxide (ITO), indium zinc oxide (IZO), amorphous indium tin oxide (a-ITO), etc.

Holes and electrons from the first and second electrodes 151 and 152 combine with each other in the light emitting layer 153 to generate excitons. The excitons generate light when transitioning from an excited state to a ground state. The light may be irradiated through the second electrode 152.

The light emitting layer 153 may include, for example, a hole-injection layer, a hole-transportation-layer, an electron-transportation-layer, and/or an electron-injection layer.

Figure 4:
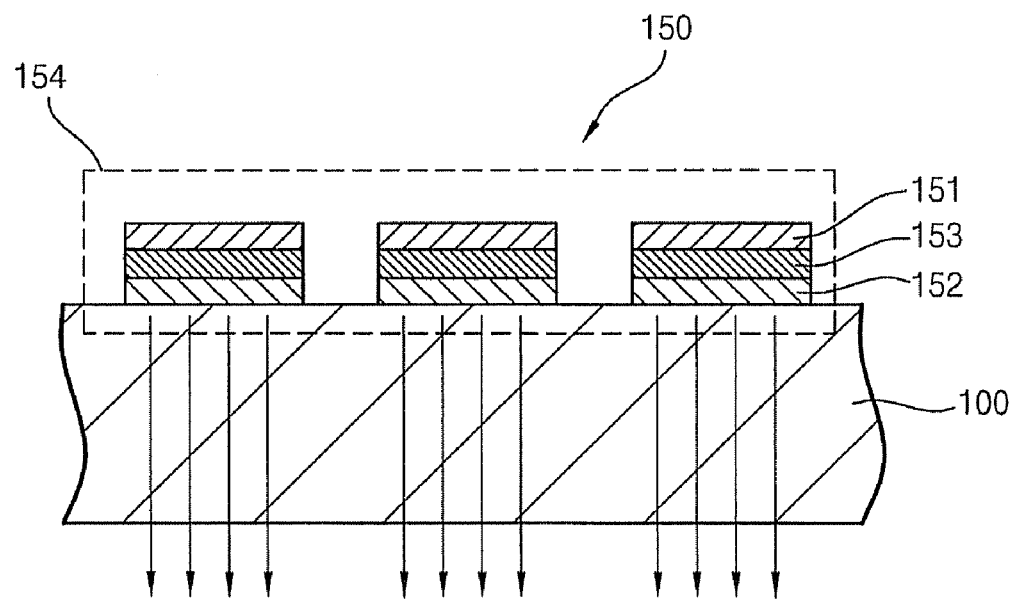
FIG. 4 is another enlarged view showing a portion 'A' of FIG. 2.

FIG. 4 is another enlarged view showing portion 'A' of FIG. 2. The display device of the present embodiment is same as that in FIG. 3 except for the organic light emitting section.

Referring to FIG. 4, the light emitting element 150 includes a plurality of organic light emitting sections 154. Each organic light emitting section 154 includes a first electrode 151, a second electrode 152 and a light emitting layer 153.

The second electrode 152 is arranged, for example, on the first substrate 100. The light emitting layer 153 is arranged on the second electrode 152, and the first electrode 151 is arranged on the light emitting layer 153. In other words, the light emitting layer 153 is arranged between the first and second electrodes 151 and 152.

The second electrode 152 may include an optically transparent and electrically conductive material such as indium tin oxide (ITO), indium zinc oxide (IZO), amorphous indium tin oxide (a-ITO), etc. For example, when the display resolution is 1024×768, 1024×768×3 second electrodes 152 may be arranged on the first substrate 100 in a matrix shape.

The first electrode 151 may include, for example, a metal such as calcium (Ca), barium (Ba), magnesium (Mg), silver (Ag), copper (Cu), aluminum (Al), and an alloy thereof.

Holes and electrons from the first and second electrodes 151 and 152 combine with each other in the light emitting layer 153 to generate excitons. The excitons generate light when transitioning from an excited state to a ground state. The light generated by the light emitting layer 153 travels toward the first substrate 100. In other words, the light may be irradiated through the second electrode 152 and the first substrate 100.

The light emitting layer 153 may include, for example, a hole-injection layer, a hole-transportation-layer, an electron-transportation-layer and/or an electron-injection layer.

Figure 5:
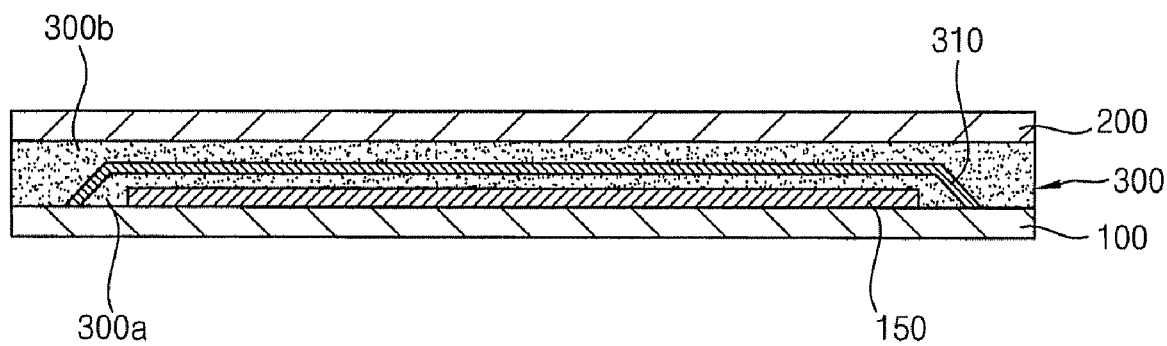
FIG. 5 is a cross-sectional view showing a display device according to another exemplary embodiment of the present invention.

FIG. 5 is a cross-sectional view showing a display device according to another exemplary embodiment of the present invention. The display device of the present embodiment may be substantially the same as that in FIG. 2 except for a protection layer. Thus, the same reference numerals will be used to refer to the same or like parts as those described in FIG. 2 and any further explanation concerning the above elements will be omitted.

Referring to FIG. 5, a light emitting element 150 may be formed on a first substrate 100. A first blocking layer 300*a* is arranged on the light emitting element 150. The first blocking layer 300*a* prevents the light emitting element 150 from being exposed to moisture and/or air.

A protection layer 310 may be formed on the first blocking layer 300*a*. The protection layer 310 may be an organic layer including organic material, an inorganic layer including inorganic material, or a multi-layer including an organic layer and an inorganic layer. The protection layer 310 may further include a desiccant layer including desiccant material.

The organic layer of the protection layer 310 may include polyacetylene, polyimide, etc.

The inorganic layer of the protection layer 310 may include silicon oxide, silicon nitride, silicon oxynitride, magnesium oxide, aluminum oxide, aluminum nitride, titanium oxide, etc.

A second blocking layer 300*b* may be arranged on the protection layer 310. The second blocking layer 300*b* covers the protection layer 310 and the first blocking layer 300a to prevent the light emitting element 150 from being exposed to moisture and air.

Figure 6:
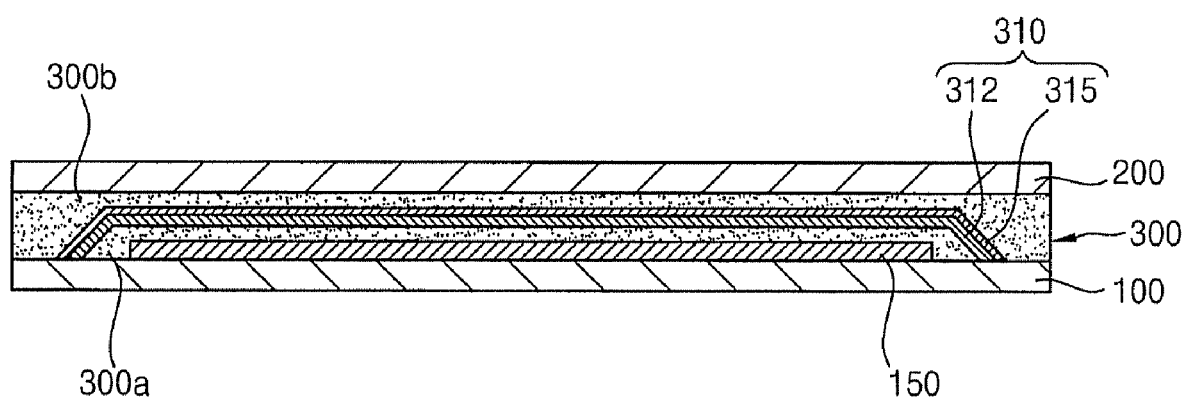
FIG. 6 is a cross-sectional view showing a display device according to still another exemplary embodiment of the present invention.

FIG. 6 is a cross-sectional view showing a display device according to still another exemplary embodiment of the present invention. The display device of the present embodiment is substantially the same as that in FIG. 5 except for a protection layer. Thus, the same reference numerals will be used to refer to the same or like parts as those described in FIG. 5 and any further explanation concerning the above elements will be omitted.

Referring to FIG. 6, a protection layer 310 may include an organic layer 312 and an inorganic layer 315. The organic layer 312 may contact with the first blocking layer 300a, and the inorganic layer 315 may contact the second blocking layer 300b. In other words, the inorganic layer 315 may be arranged on the organic layer 312.

Alternatively, the inorganic layer 315 may contact the first blocking layer 300a, and the organic layer 312 may contact the second blocking layer 300b. Furthermore, the organic layer 312 and the inorganic layer 315 may be alternately formed with each other. For example, the organic layer 312 is formed on the first blocking layer 300a, the inorganic layer 315 is formed on the organic layer 312, the organic layer 312 is formed on the inorganic layer 315, the inorganic layer 315 is formed on the organic layer 312, and so on. Additionally, a desiccant layer may be arranged between the organic layer 312 and the inorganic layer 315. The desiccant layer may include, for example, calcium (Ca), barium (Ba), calcium oxide (CaO), barium oxide (BaO), etc. Alternatively, the protection layer 310 may include an organic material and an inorganic material.

Figure 7:
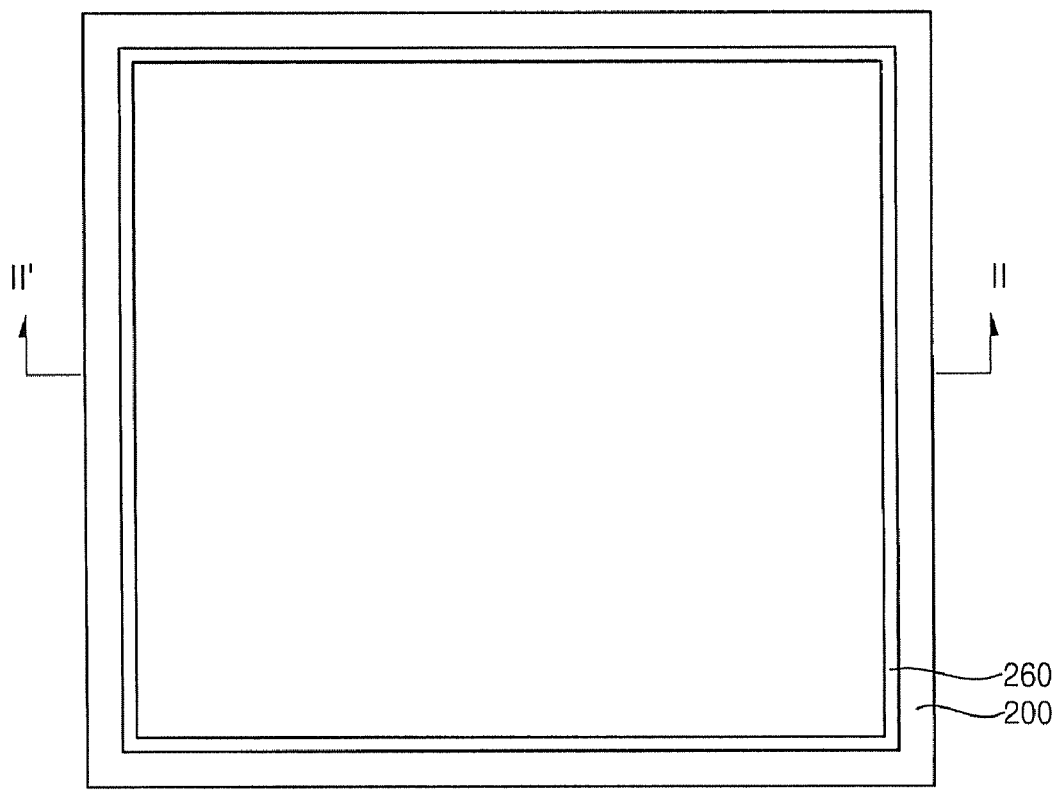
FIG. 7 is a plan view showing a display device according to still another exemplary embodiment of the present invention.
Figure 8:
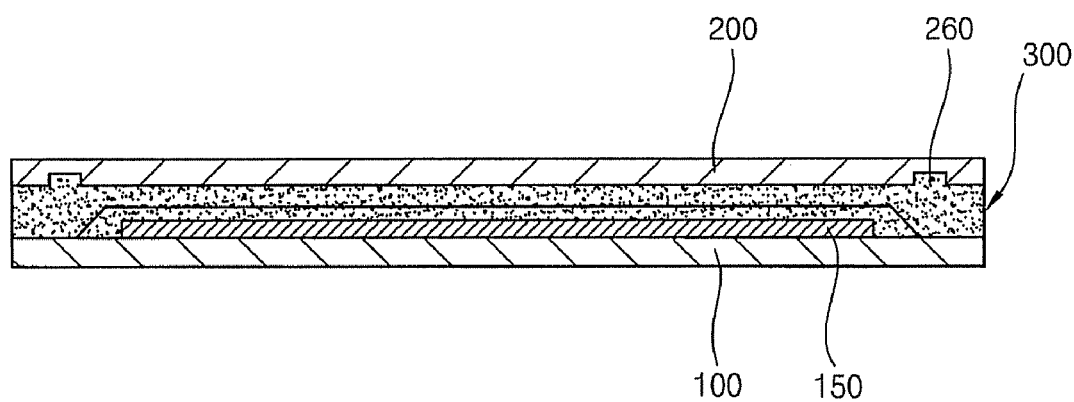
FIG. 8 is a cross-sectional view taken along line II-II' of FIG. 7.

FIG. 7 is a plan view showing a display device according to still another exemplary embodiment of the present invention. FIG. 8 is a cross-sectional view taken along line II-II' of FIG. 7. The display device of the present embodiment is substantially the same as that in FIG. 1 except for a receiving groove formed in a second substrate. Thus, the same reference numerals will be used to refer to the same or like parts as those described in FIG. 1 and any further explanation concerning the above elements will be omitted.

Referring to FIG. 7 and FIG. 8, a first substrate 100 may be formed in a substantially rectangular plate shape having a first area. A second substrate 200 may also have a substantially rectangular plate shape. The second substrate 200 has a second area that is substantially the same as the first area of the first substrate 100.

The second substrate 200 includes a receiving groove 260. The receiving groove 260 may be formed along edges of the second substrate 200. In other words, the receiving groove 260 may form a substantially rectangular shape. The receiving groove 260 may prevent a blocking member 300 from flowing toward a driving circuit section (not shown).

Alternatively, the receiving groove 260 may be formed in the first substrate 100. Further, the receiving groove 260 may have a dotted line shape.

Figure 9:
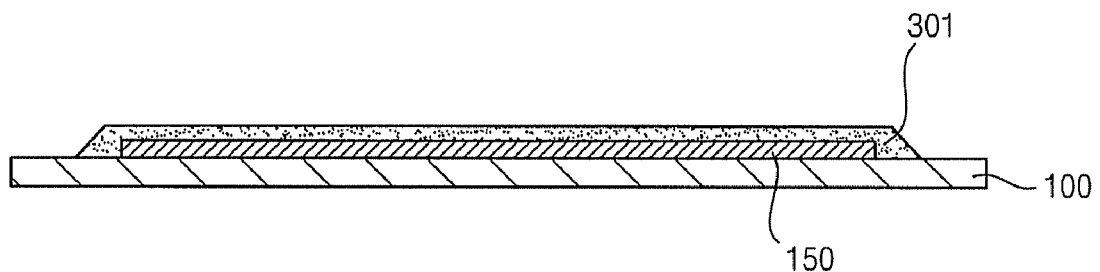
FIG. 9 is a cross-sectional view showing a first substrate according to an exemplary embodiment of the present invention.

FIG. 9 is a cross-sectional view showing a first substrate according to an exemplary embodiment of the present invention.

Referring to FIG. 9, a light emitting element 150 may be formed on a first substrate 100. The first substrate 100 may be made of a transparent material such as glass, for example. The first substrate 100 may have a substantially rectangular plate-shape planar view.

In order to form the light emitting element 150 on the first substrate 100, a first electrode (not shown) may be formed on the first substrate 100. The first electrode includes a first electrically conductive material. A light emitting layer (not shown) is formed on the first electrode. The light emitting layer includes organic material. A second electrode (not shown) may be formed on the light emitting layer. The second electrode includes a second electrically conductive material.

Examples of the first conductive material include an optically transparent material such as indium tin oxide (ITO), indium zinc oxide (IZO), amorphous indium tin oxide (a-ITO), etc., and examples of the second conductive material include an opaque metal. Alternatively, the first conductive material may include an opaque metal, and the second conductive material may include an optically transparent material such as indium tin oxide (ITO), indium zinc oxide (IZO), amorphous indium tin oxide (a-ITO), etc.

Then, a first blocking layer 301 may be formed on the first substrate 100 such that the first blocking layer 301 covers the light emitting element 150. The first blocking layer 301 includes a first blocking material that prevents the light emitting element 150 from being exposed to moisture and air.

The first blocking material may include an organic material or an inorganic material. The first blocking material may include one of a thermosetting resin and a photocurable resin. The first blocking material may be arranged on the light emitting element 150 through a screen printing method, a roll printing method, a slit coating method, etc. The first blocking layer 301 may be cured by heat or light. Further, the first blocking layer 301 may be fully cured or semi-cured. Epoxy or acrylate may be employed as the first blocking layer. When epoxy is cured, epoxy is changed to be OH-group, and when acrylate is cured, a double bonding is broken to a single bonding. For example, "semi-curing" corresponds to a state of including OH-group no more than about 95%, or double boding of no less than about 5%. Then, a combination strength of the first blocking material is substantially equal to or less than about 7N/mm$^2$. The first blocking layer 301 may be cured before the first substrate 100 is combined with the second substrate 200. Therefore, gas that is generated when curing the first blocking layer 301 may be discharged to the air, thereby preventing the light emitting element 150 from being exposed to the gas.

Figure 10:
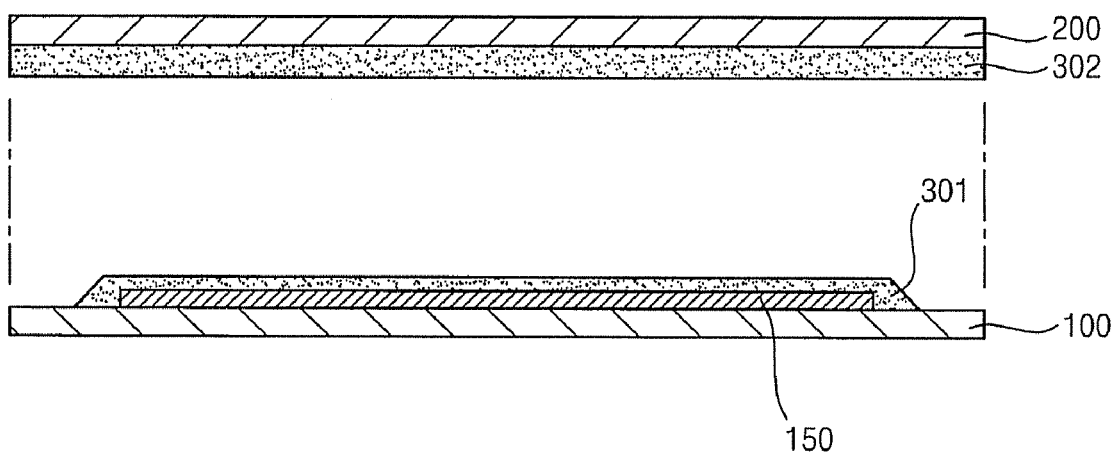
FIG. 10 is an exploded cross-sectional view showing the first substrate of FIG. 9 and a second substrate having a combination layer.

FIG. 10 is an exploded cross-sectional view showing the first substrate of FIG. 9 and a second substrate having a combination layer.

Referring to FIG. 10, a second blocking layer 302 may be formed on the second substrate 200, which may have a shape that is substantially the same as that of the first substrate 100. The second blocking layer 302 may include, for example, the same material as that of the first blocking layer 301.

Figure 11:
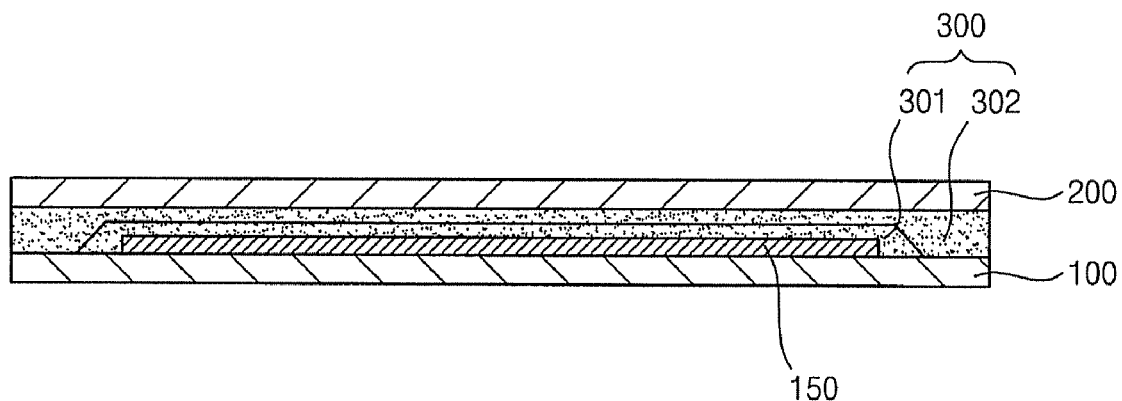
FIG. 11 is a cross-sectional view showing the first and second substrates of FIG. 10 combined with each other.

FIG. 11 is a cross-sectional view showing the first and second substrates of FIG. 10 combined with each other.

Referring to FIG. 11, the second blocking layer 302 covers the first blocking layer 301.

Then, heat or light may be applied to the second blocking layer 302 to harden the second blocking layer 302. The second blocking layer 302 may substantially fill the space between the first and second substrates 100 and 200.

According to the present embodiment, the first and second blocking layers 301 and 302 are arranged between the first and second substrates 100 and 200.

In detail, the first blocking layer 301 arranged on the first substrate 100 may be fully cured or semi-cured, and the first substrate 100 is combined with the second substrate 200 having the second blocking layer 302 formed thereon such that the second blocking layer 302 contacts the first blocking layer 301. Then, the second blocking layer 302 may be cured.

In other words, the first blocking layer 301 may be cured before combining the first and second substrates 100 and 200, so that gas that is generated when curing the first blocking layer 301 is exhausted to air. Therefore, the light emitting element may be protected.

Figure 12:
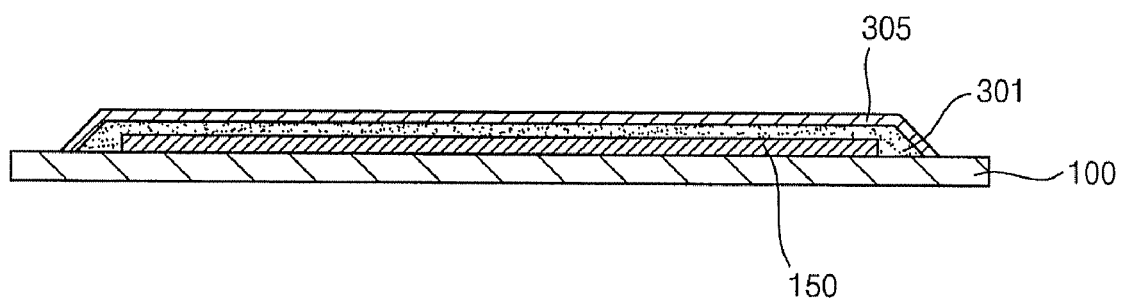
FIG. 12 is a cross-sectional view showing a method for manufacturing a display device according to an exemplary embodiment of the present invention.

FIG. 12 is a cross-sectional view showing a method for manufacturing the display device according to an exemplary embodiment of the present invention. The method of the present embodiment is substantially the same as that of the previous embodiment except for forming the first substrate. Thus, the same reference numerals will be used to refer to the same or like parts as those described in the above explanation and any further explanation concerning the above elements will be omitted.

Referring to FIG. 12, when a first blocking layer 301 is formed on a first substrate 100, a protection layer 305 may be formed on the first blocking layer 301.

The protection layer 305 may include a material that reacts with moisture or air such as calcium, barium, calcium oxide, barium oxide, etc.

Alternatively, the protection layer 305 may include an organic layer including organic material, an inorganic layer including inorganic material, or a complex layer including both the organic material and the inorganic material. The organic layer and the inorganic layer may include a desiccant material. Alternatively, the organic layer and the inorganic layer may be alternately arranged with each other. For example, the organic layer 312 is formed on the first blocking layer 300a, the inorganic layer 315 is formed on the organic layer 312, the organic layer 312 is formed on the inorganic layer 315, the inorganic layer 315 is formed on the organic layer 312, and so on.

Figure 13:
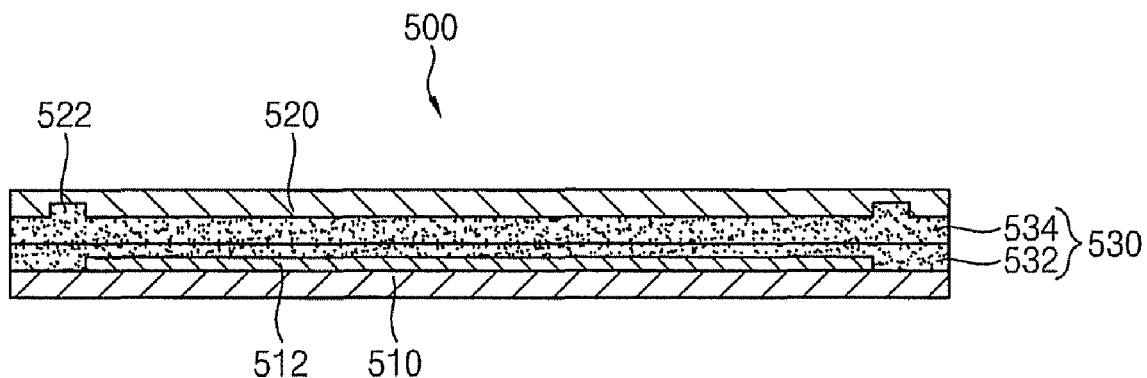
FIG. 13 is a cross-sectional view showing a structure of a display device according to an exemplary embodiment of the present invention.

FIG. 13 is a cross-sectional view showing a structure of a display device according to an exemplary embodiment of the present invention.

Referring to FIG. 13, a display device 500 may include a first substrate 510, a second substrate 520 and a blocking member 530.

The first substrate 510 may be made of a transparent material such as glass, for example. Alternatively, the first substrate 510 may include an opaque material.

A light emitting element 512 may be formed on the first substrate 510. The light emitting element 512 emits light according to an image signal provided from an external device.

An organic light emitting element may be employed as the light emitting elements 512. The light emitting element 512 may include organic light emitting sections that may be arranged in a matrix shape on the first substrate 510, and each organic light emitting section may include a first electrode, an organic light emitting layer formed on the first electrode, and a second electrode formed on the organic light emitting layer.

The second substrate 520 is arranged over the first substrate 510 such that the light emitting element 512 faces the second substrate 520. The second substrate 520 may include a transparent material or an opaque material.

When the light emitting element 512 is exposed to moisture and air, its lifespan may be reduced and display quality deteriorated.

In order to prevent the light emitting element 512 from being exposed to moisture and air, the blocking member 530 may be arranged between the first and second substrates 510 and 520. The blocking member 530 may, for example, fill the space between the first and second substrates 510 and 520 to prevent the light emitting element 512 from being exposed to moisture and air.

The blocking member 530 may include a first blocking layer 532 and a second blocking layer 534.

The first blocking layer 532 may be arranged on the first substrate 510 to cover the light emitting element 512. The first blocking layer 532 prevents the light emitting element 512 from being exposed to moisture and air. The first blocking layer 532 may be cured before combining the first and second substrates 510 and 520, so that gas that is generated during curing may be exhausted to the atmosphere.

The first blocking layer 532 may include, for example, an organic material such as polyacetylene, polyimide, epoxy resin, etc. Alternatively, the first blocking layer 532 may include an inorganic material such as silicon oxide, silicon nitride, magnesium oxide, aluminum oxide, aluminum nitride, titanium oxide, etc. The first blocking layer 532 may include one of a thermosetting resin and a photocurable resin.

The second blocking layer 534 may be, for example, arranged on the second substrate 520. The second blocking layer 534 prevents the light emitting element 512 from being exposed to moisture and air. Additionally, the second blocking layer 534 combines the first and second substrates 510 and 520.

The second blocking layer 534 may include, for example, an organic material such as polyacetylene, polyimide, epoxy resin, etc. Alternatively, the second blocking layer 534 may include an inorganic material such as silicon oxide, silicon nitride, magnesium oxide, aluminum oxide, aluminum nitride, titanium oxide, etc. The second blocking layer 534 may include one of a thermosetting resin and a photocurable resin.

As described above, the first blocking layer 532 may be cured before the first and second substrates 510 and 520 are joined together. The first blocking layer 532 may be fully cured or semi-cured.

The second substrate 520 may include a receiving groove 522. The receiving groove 522 may be formed along edges of the second substrate 520. The receiving groove 522 may prevent leakage of the material of the second blocking layer 534. Additionally, the receiving groove 522 may enhance the adhesion between the second substrate 520 and the second blocking layer 534.

Figure 14:
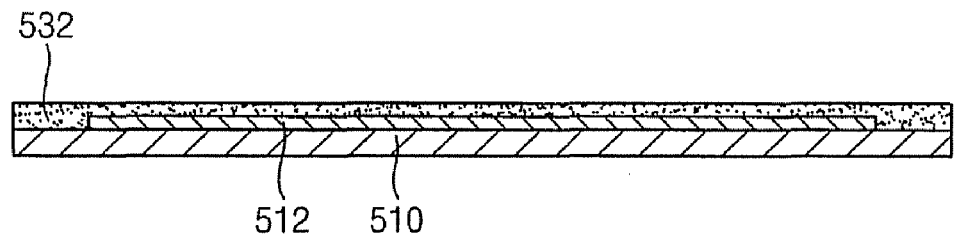
FIG. 14 is a cross-sectional view showing a first substrate, a light emitting element and a first blocking layer formed according to a method for manufacturing the display device.
Figure 15:
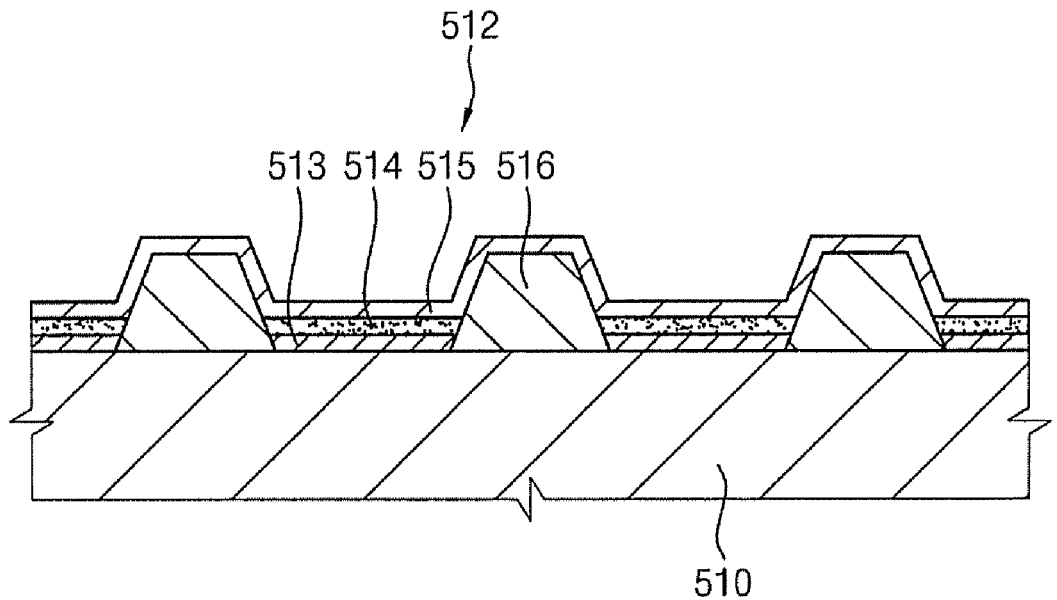
FIG. 15 is a cross-sectional view showing the light emitting element of FIG. 14.

FIG. 14 is a cross-sectional view showing a first substrate, a light emitting element and a first blocking layer formed according to a method for manufacturing the display device, and FIG. 15 is a cross-sectional view showing the light emitting element of FIG. 14.

Referring to FIG. 14 and FIG. 15, a light emitting element 512 may be formed on a first substrate 510. In order to form the light emitting element 512, first electrodes 513 may be formed on the first substrate 510. The first electrodes 513 may be arranged in a matrix shape, and they may include, for example, an optically transparent and electrically conductive material.

A partition member 516 may be arranged between the first electrodes 513. In detail, the partition member 516 may have opening portions that are arranged in a matrix shape, and the first electrodes 513 may be arranged at the opening portions, respectively, so that the first electrodes 513 are electrically insulated from each other.

Organic light emitting layers 514 may be formed on the first electrodes 513, respectively. The organic light emitting layers 514 include an organic material for emitting red, green or blue light. The organic light emitting layers 514 may be arranged on the first electrodes 513 through a deposition method, an ink jet printing method, etc.

A second electrode 515 may be formed over the first substrate 510 to cover the organic light emitting layers 514 and the partition member 516. The second electrode 515 may include, for example, a metal such as calcium, barium, magnesium, silver, copper, aluminum, an alloy thereof, etc.

A first blocking layer 532 may be formed on the first substrate 510 including the light emitting element 512. The first blocking layer 532 covers the light emitting element 512 to prevent the light emitting element 512 from being exposed to moisture and air.

The first blocking layer 532 may be formed through a silk screen printing method, a spin coating method, a slit coating method and a ejecting method, etc. For example, the first blocking layer 532 may formed through the ejecting method, which is simple and convenient.

The first blocking layer 532 may include an organic material such as polyacetylene, polyimide, epoxy resin, etc. Alternatively, the first blocking layer 532 may include an inorganic material such as silicon oxide, silicon nitride, magnesium oxide, aluminum oxide, aluminum nitride, titanium oxide, etc. Alternatively, the first blocking layer 532 may include both the organic material and the inorganic material. The first blocking layer 532 may include a thermosetting resin or a photocurable resin.

Figure 16:
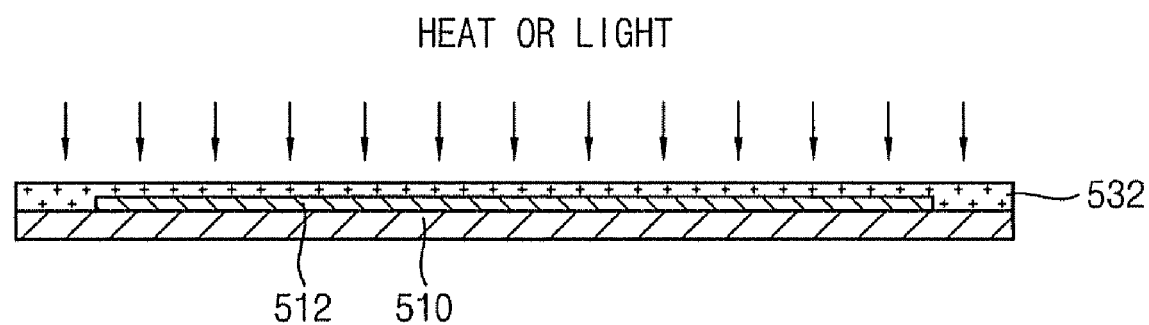
FIG. 16 is a cross-sectional view showing a process of drying solvent in the first blocking layer of FIG. 14.

FIG. 16 is a cross-sectional view showing a process of drying a solvent in the first blocking layer of FIG. 14.

Referring to FIG. 16, when the first blocking layer 532 is formed on the first substrate 510, the first blocking layer 532 may be fully cured or semi-cured.

Figure 17:
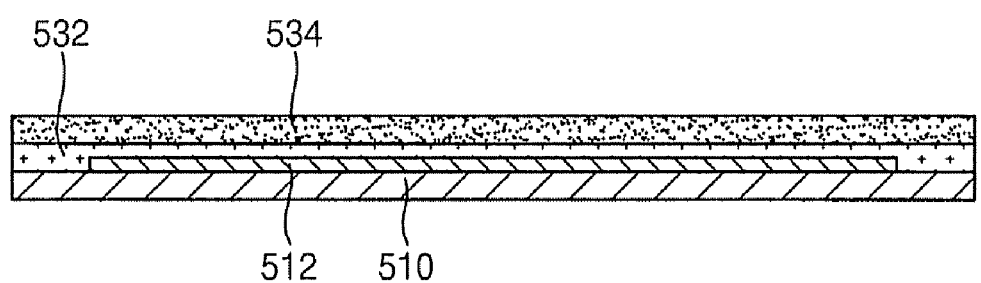
FIG. 17 is a cross-sectional view showing a second blocking layer formed on the first blocking layer of FIG. 16.

FIG. 17 is a cross-sectional view showing a second blocking layer formed on the first blocking layer of FIG. 16.

Referring to FIG. 17, a second blocking layer 534 may be formed on the first blocking layer 532 that is fully cured or semi-cured. The second blocking layer 534 may be formed through a silk screen printing method, a spin coating method, a slit coating method and a ejecting method, etc. For example, the second blocking layer 534 may be formed through the ejecting method.

The second blocking layer 534 may include an organic material such as polyacetylene, polyimide, epoxy resin, etc. Alternatively, the second blocking layer 534 may include an inorganic material such as silicon oxide, silicon nitride, magnesium oxide, aluminum oxide, aluminum nitride, titanium oxide, etc. Alternatively, the second blocking layer 534 may include both the organic material and the inorganic material. The second blocking layer 534 may include a thermosetting resin or a photocurable resin.

The second blocking layer 534 protects the light emitting element 512 and combines the first and second substrates 510 and 520.

Figure 18:
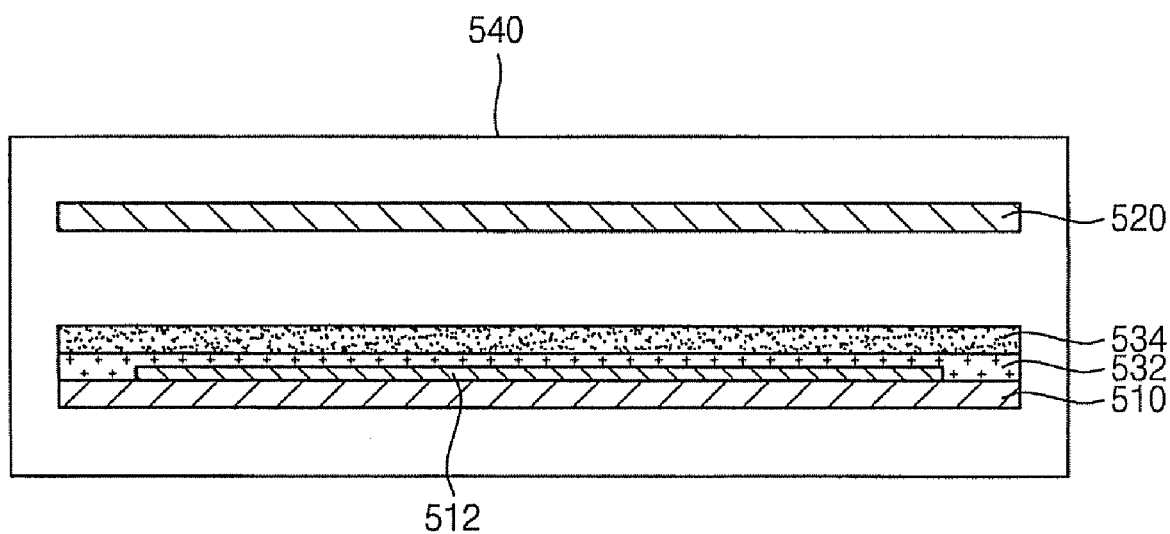
FIG. 18 is a cross-sectional view showing a process of combining the first and second substrates.

FIG. 18 is a cross-sectional view showing a process of coupling the first and second substrates.

Referring to FIG. 18, the first substrate 510, including the second blocking layer 534, and the second substrate 520 are aligned such that the second substrate 520 faces the second blocking layer 534 in a chamber 540.

The chamber 540 may have a first pressure that is lower than atmospheric pressure. Alternatively, the chamber 540 may have a second pressure that is substantially same as atmospheric pressure or higher than atmospheric pressure.

When the pressure of the chamber 540 is adjusted, the first and second substrates 510 and 520 may be assembled with each other. The first and second substrates 510 and 520 are combined with each other through the second blocking layer 534.

When assembling the first and second substrates 510 and 520, voids may be generated between the first and second substrates 510 and 520, which may deteriorate display quality.

Figure 19:
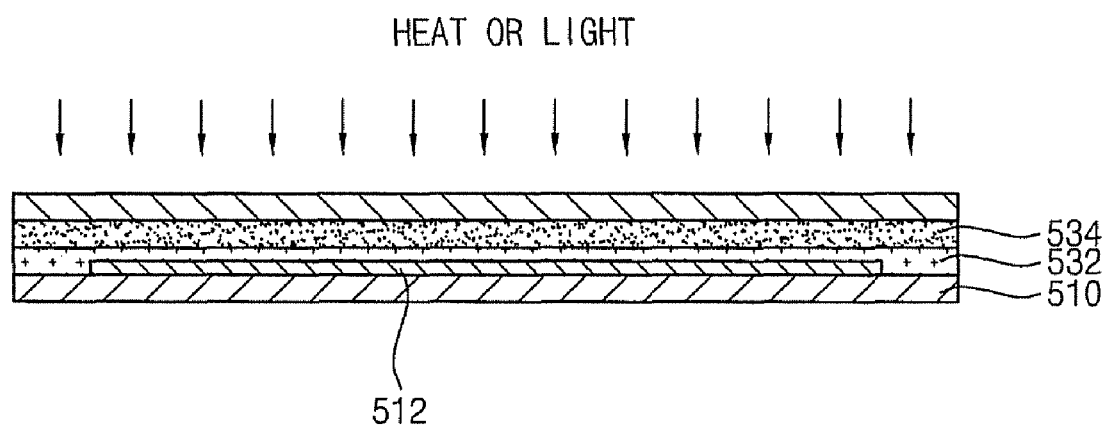
FIG. 19 is a cross-sectional view showing a process of curing the second blocking layer of FIG. 18.

FIG. 19 is a cross-sectional view showing a process of curing the second blocking layer of FIG. 18.

Referring to FIG. 19, in order to reduce the voids, the first and second substrates 510 and 520 may be assembled in the chamber 540 and completely combined with each other outside of the chamber 540. For example, the first and second substrates 510 and 520 are combined with each other under a second pressure that is higher than the first pressure.

Heat or light may be applied to the second blocking layer 534 in order to harden the second blocking layer 534, so that the first and second substrates 510 and 520 may be completely combined.

Figure 20:
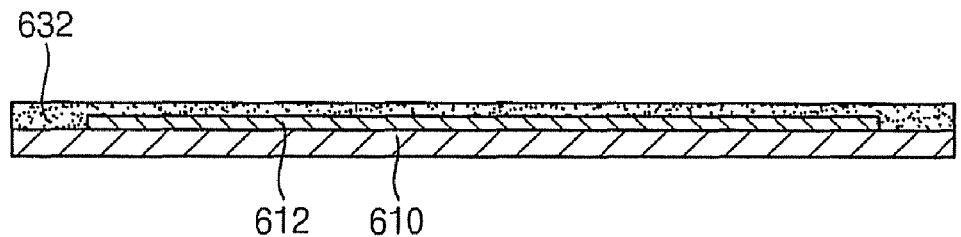
FIG. 20 is a cross-sectional view showing the light emitting element and the first blocking layer formed on a substrate according to another method for manufacturing a display device.

FIG. 20 is a cross-sectional view showing the light emitting element and the first blocking layer formed on a substrate according to another method for manufacturing a display device.

Referring to FIG. 20, a light emitting element 612 may be formed on a transparent first substrate 610. The light emitting element 612 emits light according to an image signal provided by an external device. The light emitting element 612 of the present embodiment is substantially the same as that of the previous embodiment. Thus, the same reference numerals will be used to refer to the same or like parts as those described in the previous embodiment and any further explanation concerning the above elements will be omitted.

In the present embodiment, the first blocking layer 632, which covers the light emitting element 612, may be formed through a silk screen printing method, a spin coating method, a slit coating method and a ejecting method, etc. For example, the first blocking layer 632 may be formed through the ejecting method, which is simple and convenient.

The first blocking layer 632 may include an organic material such as polyacetylene, polyimide, epoxy resin, etc. Alternatively, the first blocking layer 632 may include an inorganic material such as silicon oxide, silicon nitride, magnesium oxide, aluminum oxide, aluminum nitride, titanium oxide, etc. Alternatively, the first blocking layer 632 may include both the organic material and the inorganic material. The first blocking layer 632 may include a thermosetting resin or a photocurable resin.

Figure 21:
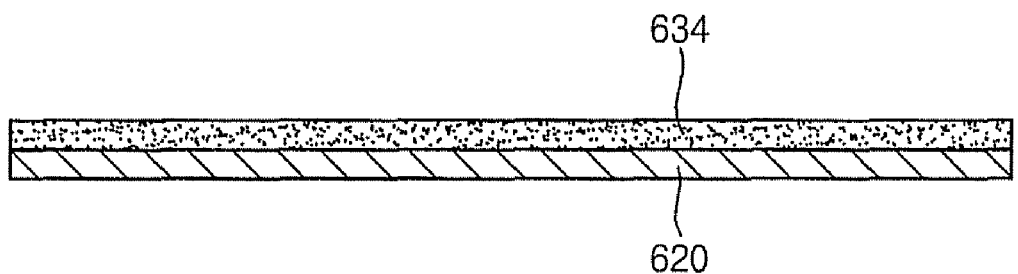
FIG. 21 is a cross-sectional view showing a second blocking layer.

FIG. 21 is a cross-sectional view showing a second blocking layer.

The second blocking layer 634 may be formed on a second substrate 620. The second blocking layer 634 may be formed through a silk screen printing method, a spin coating method, a slit coating method and a ejecting method, etc. For example, the second blocking layer 634 may be formed through the ejecting method.

The second blocking layer 634 may include an organic material such as polyacetylene, polyimide, epoxy resin, etc. Alternatively, the second blocking layer 634 may include an inorganic material such as silicon oxide, silicon nitride, magnesium oxide, aluminum oxide, aluminum nitride, titanium oxide, etc. Alternatively, the second blocking layer 634 may include both the organic material and the inorganic material. The second blocking layer 634 may include a thermosetting resin or a photocurable resin.

The second blocking layer 634 protects the light emitting element formed on the first substrate 610 and combines the first and second substrates 610 and 620 together.

Figure 22:
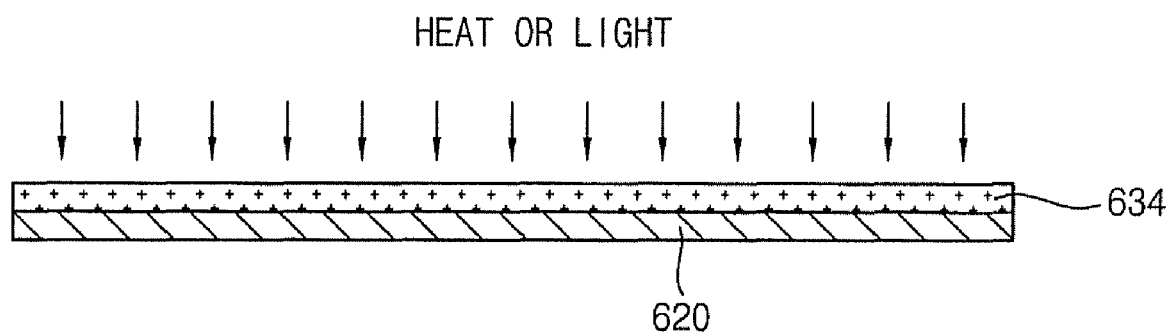
FIG. 22 is a cross-sectional view showing a process of drying solvent in the second blocking layer of FIG. 21.

FIG. 22 is a cross-sectional view showing a process of drying a solvent in the second blocking layer of FIG. 21.

Referring to FIG. 22, when the second blocking layer 634 is formed on the second substrate 620, heat or light may be applied to the second blocking layer 634 to fully cure or semi-cure it.

Figure 23:
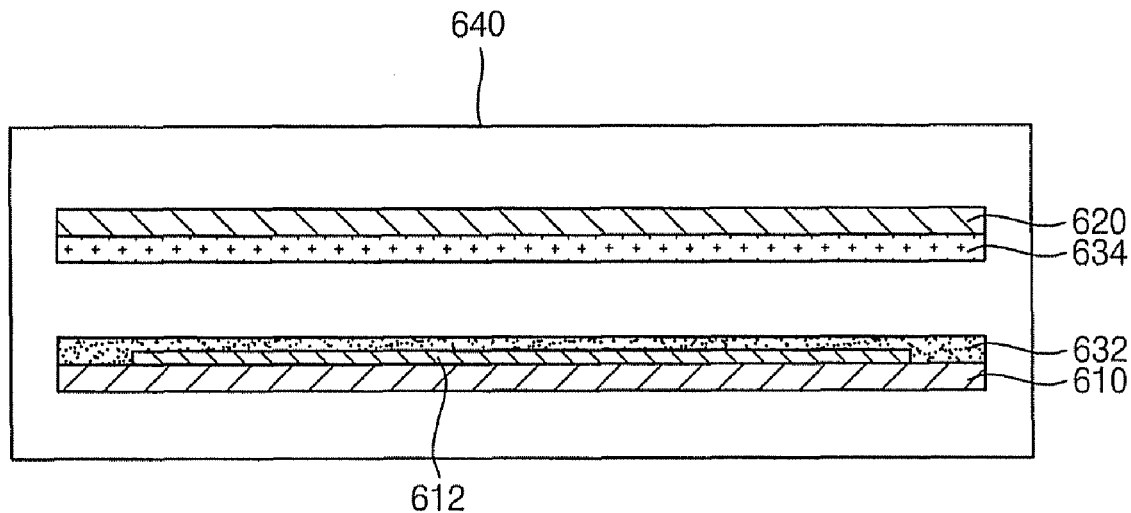
FIG. 23 is a cross-sectional view showing a process of combining the first and second substrates of FIG. 22.

FIG. 23 is a cross-sectional view showing a process of coupling the first and second substrates of FIG. 22.

Referring to FIG. 23, the second substrate 620, including the second blocking layer 634, and the first substrate 610, including the first blocking layer 632, may be aligned with each other such that the second blocking layer 634 faces the first blocking layer 632 in a chamber 640.

The chamber 640 may have a first pressure that is lower than atmospheric pressure. Alternatively, the chamber 640 may have a second pressure that is substantially the same as atmospheric pressure or higher than atmospheric pressure.

When the pressure of the chamber 640 is adjusted, the first and second substrates 610 and 620 may be assembled with each other. The first and second substrates 610 and 620 are combined with each other through the first blocking layer 632 and the second blocking layer 634.

When assembling the first and second substrates 610 and 620, voids may be generated between the first and second substrates 610 and 620, which may deteriorate display quality.

Figure 24:
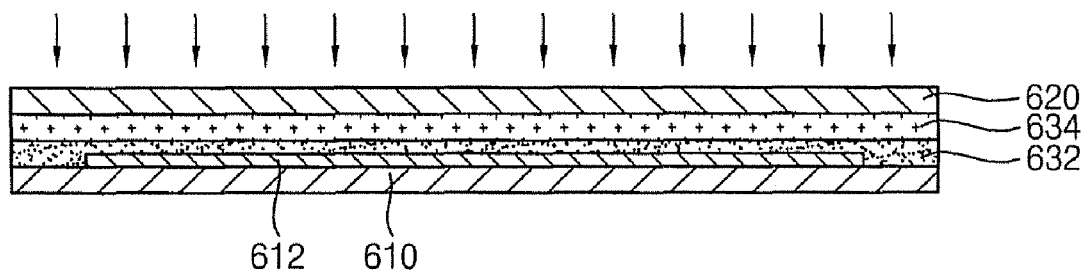
FIG. 24 is a cross-sectional view showing a process of curing the second blocking layer of FIG. 23.

FIG. 24 is a cross-sectional view showing a process of curing the second blocking layer of FIG. 23.

Referring to FIG. 24, in order to reduce the voids, the first and second substrates 610 and 620 assembled in the chamber 640 may be completely combined with each other outside of the chamber 640. For example, the first and second substrates 610 and 620 may be combined with each other under a second pressure that is higher than the first pressure.

Heat or light may be applied to the second blocking layer 634 in order to harden the second blocking layer 634, so that the first and second substrates 610 and 620 are completely combined.

Figure 25:
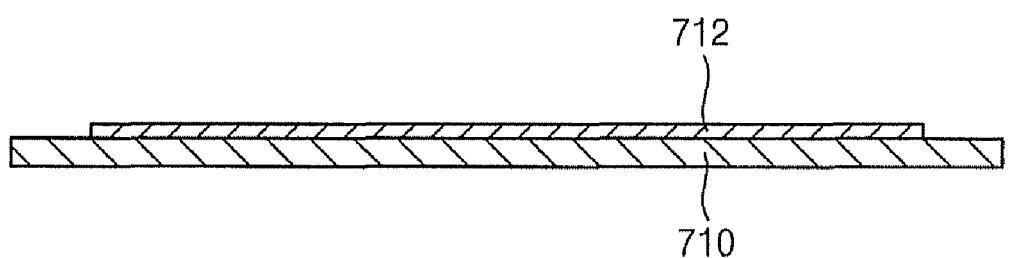
FIG. 25 is a cross-sectional view showing a light emitting element formed on a second substrate according to still another method for manufacturing a display device.

FIG. 25 is a cross-sectional view showing a light emitting element formed on a second substrate according to still another method for manufacturing a display device.

Referring to FIG. 25, a light emitting element 712 may be formed on a transparent first substrate 710. The light emitting element 712 emits light according to an image signal provided by an external device. The light emitting element 712 of the present embodiment is substantially the same as that of the previous embodiment. Thus, the same reference numerals will be used to refer to the same or like parts as those described in the previous embodiment and any further explanation concerning the above elements will be omitted.

Figure 26:
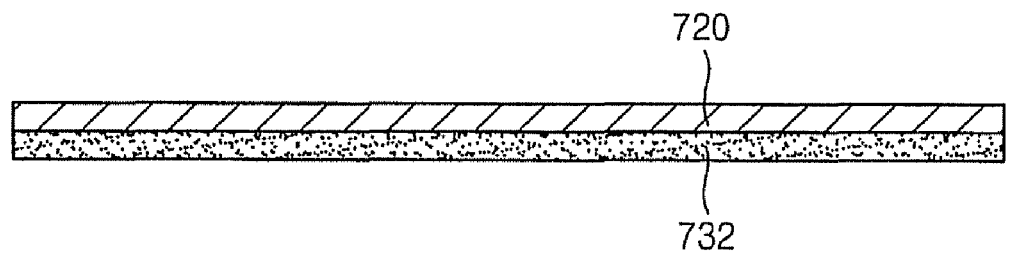
FIG. 26 is a cross-sectional view showing a first blocking layer formed on the second substrate.

FIG. 26 is a cross-sectional view showing a first blocking layer formed on the second substrate.

Referring to FIG. 26, a first blocking layer 732 may be formed on the second substrate 720. The first blocking layer 732 may be formed through a silk screen printing method, a spin coating method, a slit coating method and a ejecting method, etc. For example, the first blocking layer 732 may be formed through the ejecting method, which is simple and convenient.

The first blocking layer 732 may include an organic material such as polyacetylene, polyimide, epoxy resin, etc. Alternatively, the first blocking layer 732 may include an inorganic material such as silicon oxide, silicon nitride, magnesium oxide, aluminum oxide, aluminum nitride, titanium oxide, etc. Alternatively, the first blocking layer 732 may include both the organic material and the inorganic material. The first blocking layer 732 may include a thermosetting resin or a photocurable resin.

The first blocking layer 732 prevents the light emitting element 712 from being exposed to moisture and air.

Figure 27:
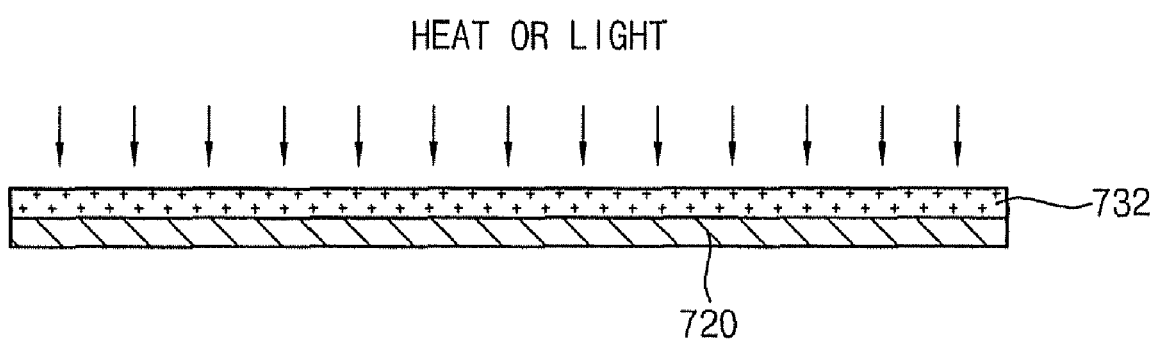
FIG. 27 is a cross-sectional view showing a process of drying solvent in the first blocking layer of FIG. 26.

FIG. 27 is a cross-sectional view showing a process of drying a solvent in the first blocking layer 732 of FIG. 26.

Referring to FIG. 27, the first blocking layer 732 may be fully cured or semi-cured.

Figure 28:
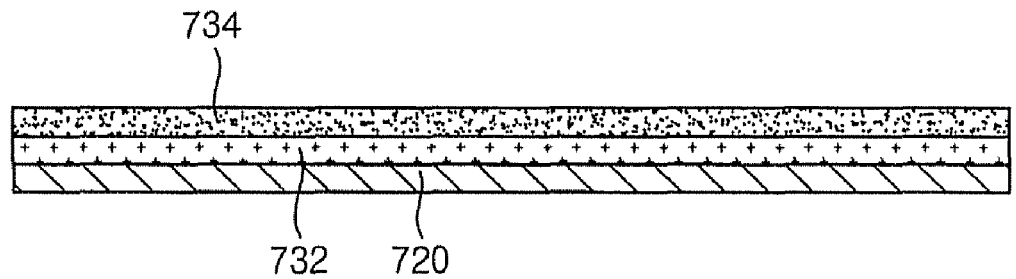
FIG. 28 is a cross-sectional view showing a second blocking layer formed on the first blocking layer of FIG. 27.

FIG. 28 is a cross-sectional view showing a second blocking layer formed on the first blocking layer in FIG. 27.

Referring to FIG. 28, a second blocking layer 734 may be formed on the first blocking layer 732.

The second blocking layer 734 may include an organic material such as polyacetylene, polyimide, epoxy resin, etc. Alternatively, the second blocking layer 734 may include an inorganic material such as silicon oxide, silicon nitride, magnesium oxide, aluminum oxide, aluminum nitride, titanium oxide, etc. Alternatively, the second blocking layer 734 may include both the organic material and the inorganic material. The second blocking layer 734 may include a thermosetting resin or a photocurable resin.

The second blocking layer 734 prevents the light emitting element 712 from being exposed to moisture and air. Additionally, the second blocking layer 734 combines the first and second substrates 710 and 720.

Figure 29:
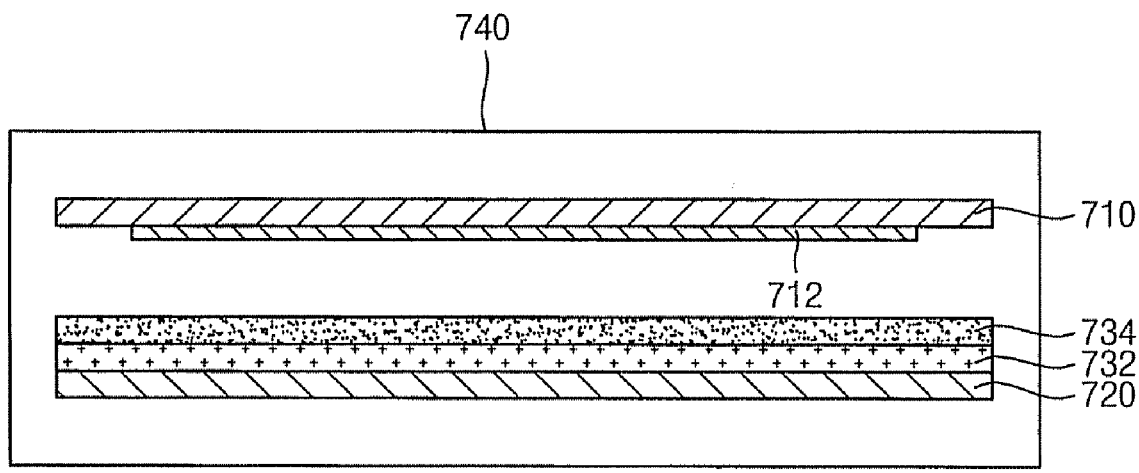
FIG. 29 is a cross-sectional view showing a process of combining the second substrate of FIG. 28 with a first substrate.

FIG. 29 is a cross-sectional view showing a process of combining the second substrate of FIG. 28 with a first substrate.

Referring to FIG. 29, the first substrate 710, including the light emitting element 712, and the second substrate 720, including the first and second blocking layers 732 and 734, may be aligned such that the second blocking layer 734 faces the light emitting element 712 in a chamber 740.

The chamber 740 may have a first pressure that is lower than atmospheric pressure. Alternatively, the chamber 740 may have a second pressure that is substantially same as atmospheric pressure or higher than atmospheric pressure.

When the pressure of the chamber 740 is adjusted, the first and second substrates 710 and 720 may be assembled with each other. The first and second substrates 710 and 720 are combined with each other through the second blocking layer 734.

When assembling the first and second substrates 710 and 720, voids may be generated between the first and second substrates 710 and 720, which may deteriorate display quality.

Figure 30:
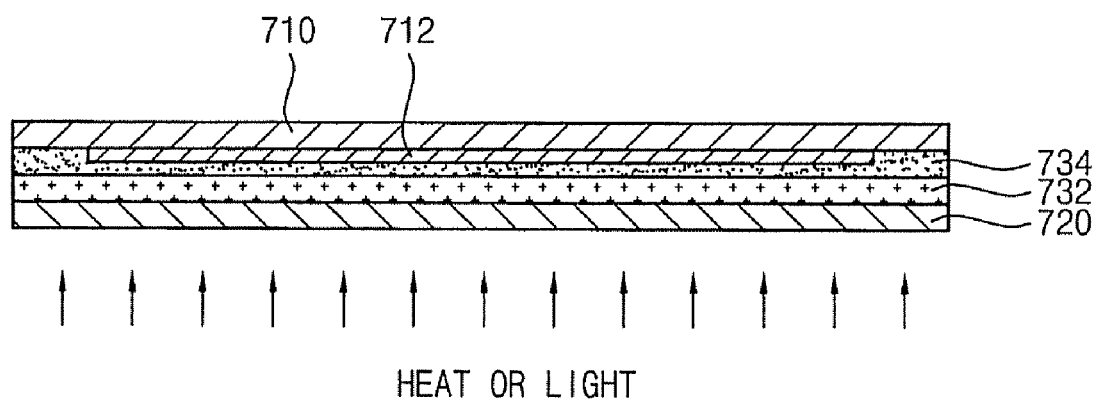
FIG. 30 is a cross-sectional view illustrating a process of curing the second blocking layer of FIG. 29.

FIG. 30 is a cross-sectional view showing a process of curing the second blocking layer of FIG. 29.

Referring to FIG. 30, in order to reduce the voids, the first and second substrates 710 and 720 assembled in the chamber 740 may be completely combined with each other outside of the chamber 740. For example, the first and second substrates 710 and 720 may be combined with each other under a second pressure that is higher than the first pressure.

Heat or light may be applied to the second blocking layer 734 in order to harden the second blocking layer 734, so that the first and second substrates 710 and 720 may be completely combined.

Figure 31:
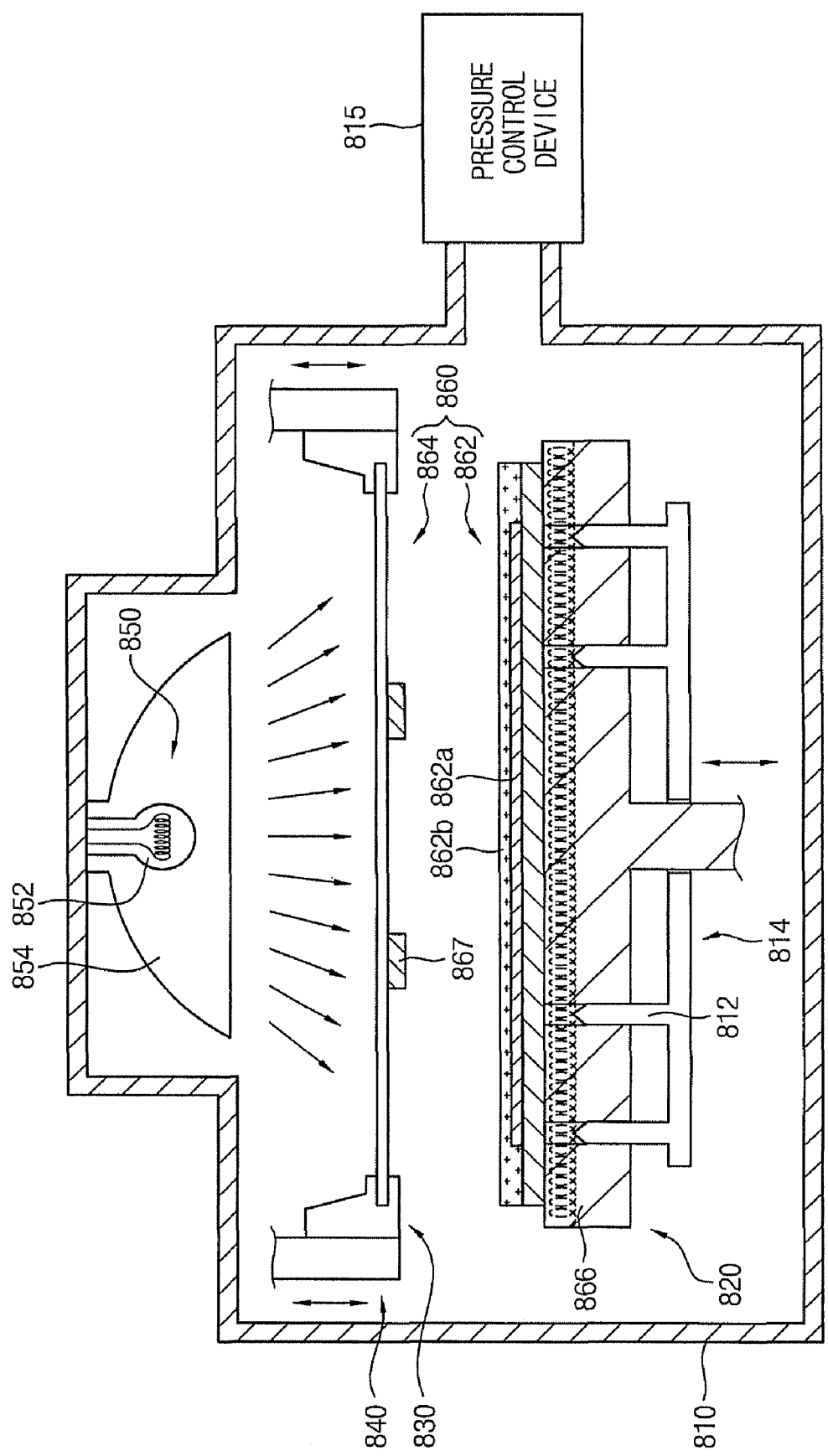
FIG. 31 is a schematic cross-sectional view showing an apparatus for manufacturing a display device.

FIG. 31 is a schematic cross-sectional view showing an apparatus for manufacturing a display device.

Referring to FIG. 31, an apparatus 800 for manufacturing a display device may include a chamber 810, a supporting unit 820, a gripper 830, a transferring unit 840 and an optical unit 850.

The chamber 810 has a large enough volume to receive a substrate unit 860, and the chamber 810 provides the substrate unit 860 with a substantially closed environment. The chamber 810 may include a pressure control device 815 for controlling a pressure of the chamber 810.

The pressure control device 815 adjusts the pressure of the chamber 810 to be higher than, lower than, or substantially the same as atmospheric pressure. For example, a vacuum pump may be employed as the pressure control device 815.

The supporting unit 820 may be arranged on a bottom portion of the chamber 810. The supporting unit 820 supports the substrate unit 860.

The substrate unit 860 includes a first substrate 862 and a second substrate 864. A light emitting element 862a may be formed on the first substrate 862. A first blocking layer 862b may be formed on the first substrate 862 such that the first blocking layer 862b covers the light emitting element 862a. Solvent of the first blocking layer 862b may be removed outside of the chamber 810. Therefore, the first blocking layer 862b in the chamber 810 may substantially include no solvent.

The second substrate 864 may be aligned such that it faces the first substrate 862 in the chamber 810. A second blocking layer (not shown) may be formed on one of the second substrate 864 and the first blocking layer 862b. For example, the second blocking layer may be formed on the second substrate 864. The second blocking layer is combined with the first blocking layer 862b, so that the first and second substrates 862 and 864 are combined with each other.

The supporting unit 820 supports, for example, the first substrate 862.

The supporting unit 820 may include a lift pin assembly 814. The lift pin assembly 814 lifts the first substrate 862 supported by the supporting unit 820.

The supporting unit 820 optionally includes a heater 866 for heating the first substrate 862. When the first blocking layer 862b includes a thermosetting resin, the heater 866 heats the first blocking layer 862b, so that the first blocking layer 862b may be cured.

The gripper 830 grips the second substrate 864 to assist with arranging the second substrate 864 in a proper position.

The transferring unit 840 is combined with the gripper 830. The transferring unit 840 transfers the gripper 830 along a longitudinal direction to move the second substrate 864 toward the first substrate 862. The transferring unit 840 may be formed on the supporting unit 820.

In order to prevent the second substrate 864 from sagging, a robot arm 867 may support the second substrate 864. The robot arm 867 moves together with the gripper 830 along the longitudinal direction.

The optical unit 850 may be arranged at an upper portion of the chamber 810. The optical unit 850 includes a lamp 852 and a light reflecting plate 854. The lamp 852 generates light, such as ultraviolet light, and the light reflecting plate 854 reflects the light generated by the lamp 852.

Figure 32:
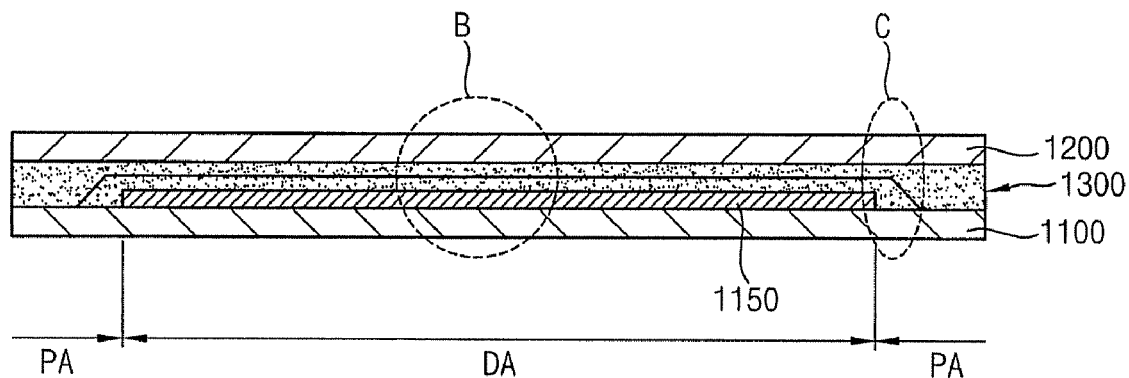
FIG. 32 is a cross-sectional view illustrating a display device in accordance with another exemplary embodiment of the present invention.

FIG. 32 is a cross-sectional view illustrating a display device in accordance with another exemplary embodiment of the present invention. The display device of the present embodiment may be substantially the same as that in FIG. 2 except for a light emitting element. Thus, the same reference numerals will be used to refer to the same or like parts as those described in FIG. 2 and any further explanation concerning the above elements will be omitted.

Referring to FIG. 32, a display device may include a first substrate 1100, a second substrate 1200 and a blocking member 1300.

The display device has a display area DA and a peripheral area PA surrounding the display area DA. An image is displayed in the display area DA.

The first substrate 1100 includes a light emitting element 1150 in the display area DA.

Figure 33:
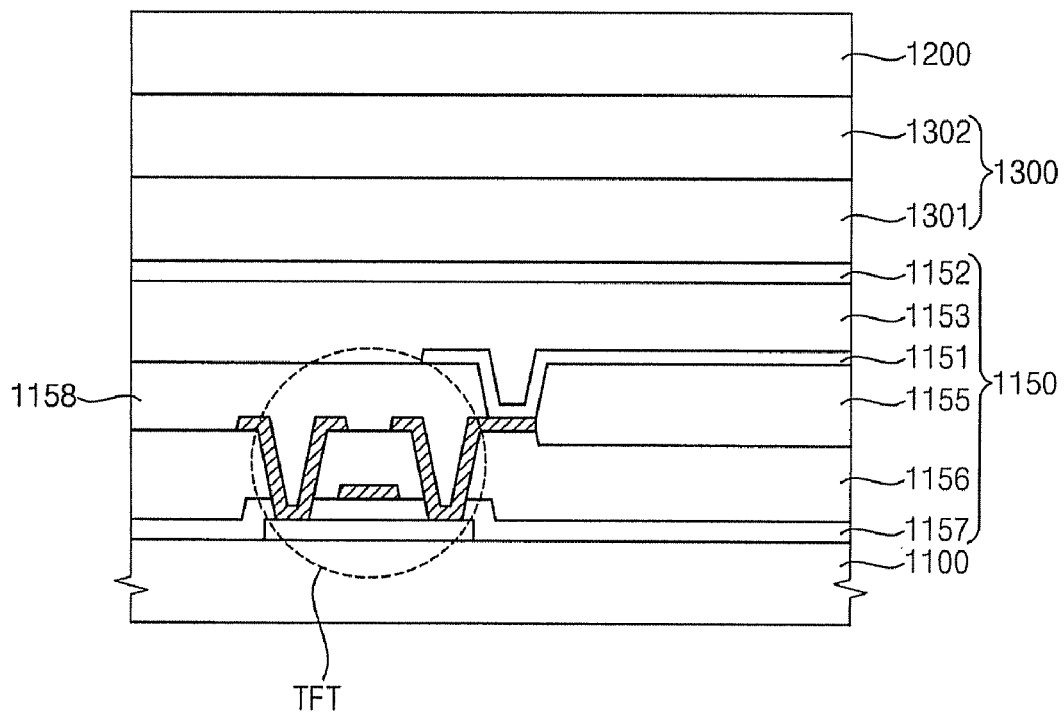
FIG. 33 is an enlarged view showing portion 'B' of FIG. 32.

FIG. 33 is an enlarged view showing portion 'B' of FIG. 32.

Referring to FIG. 33, the light emitting element 1150 includes a thin film transistor TFT, a base insulating layer 1157, a gate insulating layer 1156, a color filter 1155, a partition member 1158, a first electrode 1151, a light emitting layer 1153 and a second electrode 1152.

The base insulating layer 1157 is formed on the first substrate 1100, and covers a semiconductor pattern of the thin film transistor TFT.

The gate insulating layer 1156 is formed on the base insulating layer 1157, and covers a gate electrode of the thin film transistor TFT.

The partition member 1158 is formed on the gate insulating layer 1156, and defines a pixel region.

The color filter 1155 is formed on the gate insulating layer 1156 in the pixel region defined by the partition member 1158.

The first electrode 1151 is formed on the partition member 1158 and the color filter 1155, and is electrically connected to a drain electrode of the thin film transistor TFT.

The light emitting layer 1153 is formed on the partition member 1158 and the first electrode 1151.

The second electrode 1152 covers the light emitting layer 1153.

The blocking member 1300 makes contact with the second electrode 1152 and the second substrate 1200, and includes a first blocking layer 1301 and a second blocking layer 1302.

The first blocking layer 1301 makes contact with the second electrode 1152, and covers the second electrode 1152.

The second blocking layer 1302 is formed on the first blocking layer 1301, and makes contact with the second substrate 1200.

Figure 34:
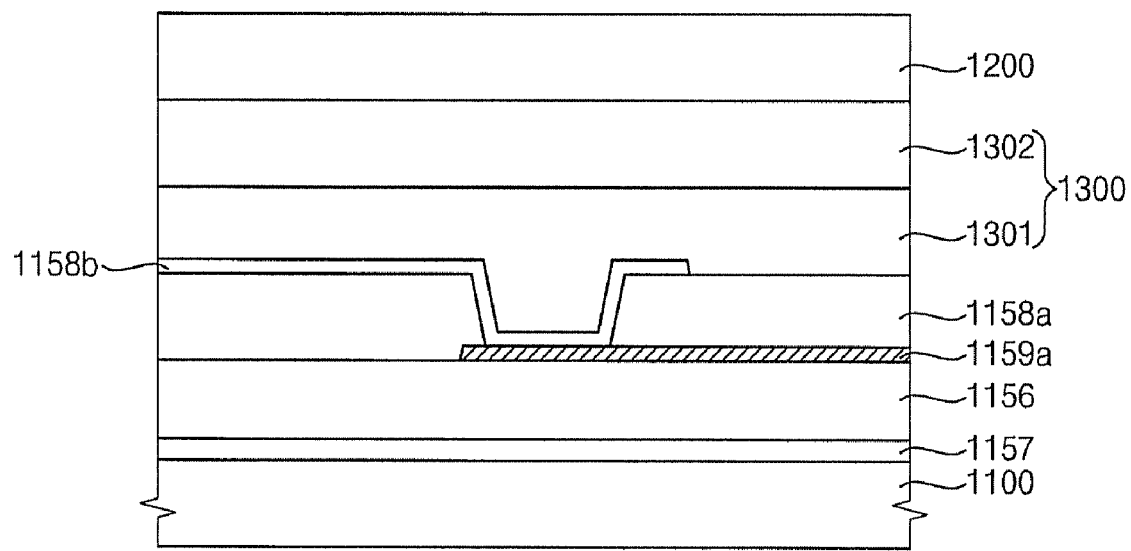
FIG. 34 is an enlarged view showing portion 'C' of FIG. 32.

FIG. 34 is an enlarged view showing portion 'C' of FIG. 32.

Referring to FIG. 34, a data pad 1159a is formed on the gate insulating layer 1156. A gate pad (not shown) may be formed on the base insulating layer 1157.

A transmission pattern 1159b is formed on an insulating layer 1158a that may be formed from the same layer as the partition member 1158. The transmission pattern 1159b may be electrically connected to the data pad 1159a through a contact hole formed through the insulating layer 1158a. For example, the transmission pattern 1159b may be formed from the same layer as the first electrode 1151 or the second electrode 1152. The insulating layer 1158a may include an inorganic layer or an organic layer.

The data pad 1159a and the transmission pattern 1159b are formed in the peripheral area PA.

The blocking member 1300 makes contact with the transmission pattern 1159b and the insulating layer 1158a. For example, the first blocking layer 1301 makes contacts with the transmission pattern 1159b and the insulating layer 1158a.

Figure 35:
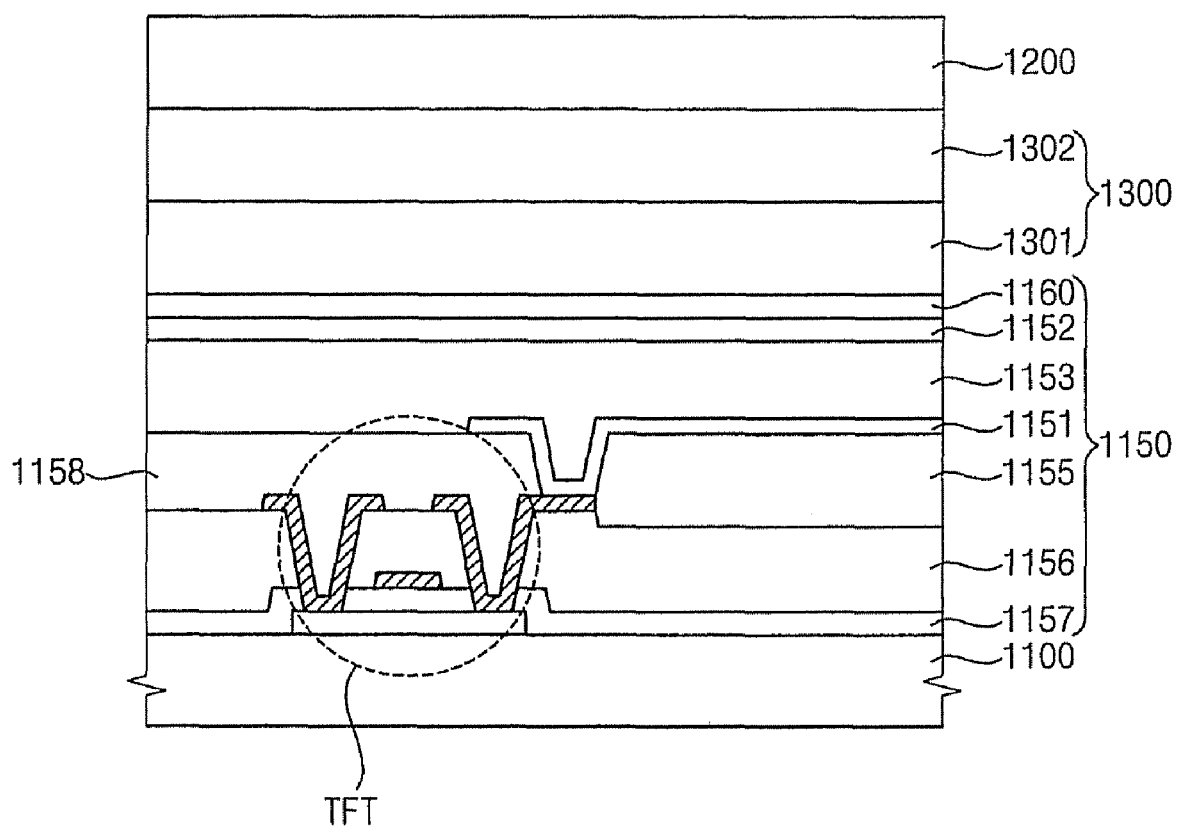
FIG. 35 is a cross-sectional view illustrating a display area of a display device in accordance with another exemplary embodiment of the present invention.

FIG. 35 is a cross-sectional view illustrating a display area of a display device in accordance with another exemplary embodiment of the present invention. The display device of the present embodiment may be substantially the same as that in FIGS. 32 to 34 except for a cover layer. Thus, the same reference numerals will be used to refer to the same or like parts as those described in FIGS. 32 to 34 and any further explanation concerning the above elements will be omitted.

Referring to FIG. 35, a cover layer 1160 is formed between a second electrode 1152 and a first blocking layer 1301 of the blocking member 1300 in the display area DA. The cover layer 1160 may makes contact with the first blocking layer 1301 of the blocking member 1300.

The cover layer 1160 may include inorganic material such as silicon nitride, silicon oxide, LiF, MgO, etc. Alternatively, the cover layer 1160 may include an organic material such as a high polymer. The cover layer 1160 may also include a multi-layered structure including the inorganic layer and the organic layer.

Figure 36:
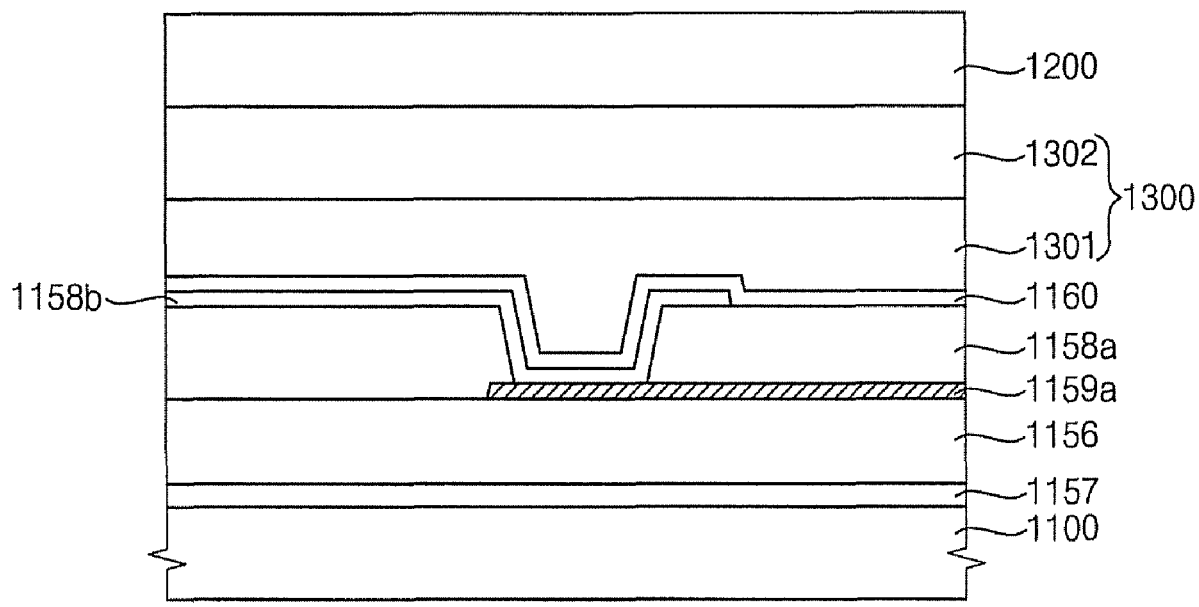
FIG. 36 is a cross-sectional view illustrating a peripheral area of the display device of FIG. 35.

FIG. 36 is a cross-sectional view illustrating a peripheral area of the display device of FIG. 35.

Referring to FIG. 36, the cover layer 1160 covers an insulating layer 1158a and a transmission pattern 1159b in the peripheral area PA.

According to embodiments of the present invention, a light emitting element may be arranged between the first and second substrates and protected by the blocking member having the first and second blocking layers, so that the light emitting element is prevented from being exposed to moisture and air. Here, the first blocking layer may cover the light emitting element. Then, the first blocking layer may be cured to exclude gas contained in the first blocking layer. The second blocking layer may then be arranged between the first blocking layer and the second substrate to further prevent the light emitting element from being exposed to moisture and air and to combine the first and second substrates.

Embodiments of the present invention may be applied to different types of display devices. For example, embodiments of the present invention may be applied to passive matrix OLEDs, as well as active matrix OLEDs, which include at least two thin film transistors and a capacitor for driving each pixel.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
    a first substrate comprising a light emitting element, the light emitting element including:
        a first electrode;
        a second electrode facing the first electrode; and
        an organic light emitting layer arranged between the first electrode and the second electrode;
    a second substrate facing the first substrate;
    a blocking member that is arranged between the first substrate and the second substrate, the blocking member contacting the second electrode of the light emitting element and the second substrate to cover the light emitting element, and
    a protection layer arranged between the blocking member and the light emitting element;
    wherein the blocking member comprises:
        a first blocking layer disposed between the second electrode and the protection layer, and
        a second blocking layer disposed between the protection layer and the second substrate.

2. The display device of claim 1, wherein the second substrate comprises glass.

3. The display device of claim 1, wherein the second substrate is about 0.1 mm to about 10 mm thick.

4. The display device of claim 1, wherein the second substrate is about 1 mm to about 10 mm thick.

5. The display device of claim 1, wherein at least one of the first blocking layer and the second blocking layer comprises at least one of a thermosetting resin and a photocurable resin.

6. The display device of claim 1, wherein at least one of the first blocking layer and the second blocking layer comprises a desiccant material.

7. The display device of claim 1, wherein the second substrate comprises a receiving groove.

8. The display device of claim 1, wherein the second blocking layer of the blocking member contacts a portion of the first substrate and the first blocking layer of the blocking member.

9. A display device, comprising:
    a first substrate comprising a light emitting element and a cover layer formed on the light emitting element;
    a second substrate facing the first substrate;
    a blocking member that is arranged between the first substrate and the second substrate, the blocking member contacting the cover layer and the second substrate to cover the light emitting element, and
    further comprising a protection layer arranged between the blocking member and the light emitting element,
    wherein the blocking member comprises:
        a first blocking layer disposed between the cover layer and the protection layer; and
        a second blocking layer disposed between the protection layer and the second substrate.

10. The display device of claim 9, wherein the protection layer comprises an organic material.

11. The display device of claim 10, wherein the protection layer comprises a high polymer.

12. The display device of claim 9, wherein the protection layer comprises an inorganic material.

13. The display device of claim 9, wherein the protection layer comprises an organic layer and an inorganic layer alternately arranged with each other.

14. The display device of claim 9, wherein the protection layer comprises a desiccant material.

15. The display device of claim 9, wherein the protection layer comprises at least one material selected from the group consisting of calcium, barium, calcium oxide, and barium oxide.

* * * * *